(12) United States Patent
Kasai et al.

US010699916B2

(10) Patent No.: US 10,699,916 B2
(45) Date of Patent: Jun. 30, 2020

(54) MOLD RELEASE FILM, PROCESS FOR ITS PRODUCTION, AND PROCESS FOR PRODUCING SEMICONDUCTOR PACKAGE

(71) Applicant: AGC Inc., Chiyoda-ku (JP)

(72) Inventors: Wataru Kasai, Chiyoda-ku (JP); Masami Suzuki, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 414 days.

(21) Appl. No.: 15/479,577

(22) Filed: Apr. 5, 2017

(65) Prior Publication Data

US 2017/0207105 A1    Jul. 20, 2017

Related U.S. Application Data

(63) Continuation of application No. PCT/JP2015/081989, filed on Nov. 13, 2015.

(30) Foreign Application Priority Data

Nov. 20, 2014  (JP) ................................ 2014-235735

(51) Int. Cl.
| | |
|---|---|
| *B29C 70/70* | (2006.01) |
| *B29C 33/68* | (2006.01) |
| *B32B 27/00* | (2006.01) |
| *B32B 27/30* | (2006.01) |
| *B32B 27/18* | (2006.01) |
| *B32B 7/12* | (2006.01) |
| *B32B 27/20* | (2006.01) |
| *B32B 27/06* | (2006.01) |
| *B32B 25/08* | (2006.01) |
| *B32B 3/30* | (2006.01) |
| *B32B 25/20* | (2006.01) |
| *B32B 27/32* | (2006.01) |

(Continued)

(52) U.S. Cl.
CPC ............ *H01L 21/565* (2013.01); *B29C 33/68* (2013.01); *B29C 70/70* (2013.01); *B32B 3/30* (2013.01); *B32B 7/12* (2013.01); *B32B 25/042* (2013.01); *B32B 25/08* (2013.01); *B32B 25/20* (2013.01); *B32B 27/00* (2013.01); *B32B 27/06* (2013.01); *B32B 27/08* (2013.01); *B32B 27/16* (2013.01); *B32B 27/18* (2013.01); *B32B 27/20* (2013.01); *B32B 27/285* (2013.01); *B32B 27/30* (2013.01); *B32B 27/302* (2013.01); *B32B 27/304* (2013.01); *B32B 27/32* (2013.01); *B32B 27/322* (2013.01); *B32B 27/34* (2013.01); *B32B 27/36* (2013.01); *H01L 21/566* (2013.01); *B29K 2995/0005* (2013.01); *B29L 2031/3406* (2013.01); *B32B 2250/02* (2013.01); *B32B 2250/24* (2013.01); *B32B 2255/10* (2013.01); *B32B 2255/26* (2013.01); *B32B 2270/00* (2013.01); *B32B 2307/21* (2013.01); *B32B 2307/306* (2013.01); *B32B 2307/50* (2013.01); *B32B 2307/538* (2013.01); *B32B 2307/54* (2013.01); *B32B 2307/7242* (2013.01); *B32B 2307/732* (2013.01); *B32B 2307/748* (2013.01); *B32B 2457/00* (2013.01); *H01L 24/16* (2013.01); *H01L 24/48* (2013.01); *H01L 2224/16225* (2013.01); *H01L 2224/48091* (2013.01); *H01L 2224/48106* (2013.01); *H01L 2224/48155* (2013.01); *H01L 2224/48225* (2013.01); *H01L 2224/73204* (2013.01); *H01L 2224/97* (2013.01); *H01L 2924/00014* (2013.01); *H01L 2924/181* (2013.01)

(58) Field of Classification Search
None
See application file for complete search history.

(56) References Cited

U.S. PATENT DOCUMENTS 4,240,993 A * 12/1980 Sun ..................... B29C 61/0616
264/456
2002/0009586 A1    1/2002 Isaki et al.
(Continued)

FOREIGN PATENT DOCUMENTS

| JP | 2001-71420 | 3/2001 |
|---|---|---|
| JP | 2002-361643 | 12/2002 |

(Continued)

OTHER PUBLICATIONS

International Search Report dated Jan. 26, 2016 in PCT/JP2015/081989, filed on Nov. 13, 2015.

*Primary Examiner* — Sheeba Ahmed
(74) *Attorney, Agent, or Firm* — Oblon, McClelland, Maier & Neustadt, L.L.P.

(57) ABSTRACT

To provide a mold release film which has excellent mold releasing property and is capable of reducing contamination of a mold in a sealing step; a process for producing the mold release film; and a process for producing a semiconductor package by using the mold release film. The mold release film 1 is a mold release film to be disposed on a surface of a mold which is to be in contact with a curable resin, in the production of a semiconductor package by disposing a semiconductor element in the mold, and sealing it with the curable resin to form a resin sealed portion. This mold release film 1 comprises a resin-side mold release layer 2 to be in contact with the curable resin at the time of forming the resin sealed portion, and a gas barrier layer 3. The gas barrier layer 3 contains at least one polymer (I) selected from the group consisting of a polymer having vinyl alcohol units and a polymer having vinylidene chloride units, and the thickness of the gas barrier layer 3 is from 0.1 to 5 μm.

13 Claims, 4 Drawing Sheets

(51) Int. Cl.
  *B32B 27/16* (2006.01)
  *B32B 27/34* (2006.01)
  *B32B 27/08* (2006.01)
  *H01L 21/56* (2006.01)
  *B32B 27/28* (2006.01)
  *B32B 25/04* (2006.01)
  *B32B 27/36* (2006.01)
  *B29L 31/34* (2006.01)
  *H01L 23/00* (2006.01)

(56) References Cited

U.S. PATENT DOCUMENTS

2009/0053528 A1\* 2/2009 Okuya ................... B29C 33/68
 428/421
2012/0237747 A1 9/2012 Tai et al.
2015/0125676 A1 5/2015 Mizutani

FOREIGN PATENT DOCUMENTS

| JP | 2004-79566 | 3/2004 |
| JP | 2014-28508 | 2/2014 |
| WO | WO 2007/125834 A1 | 11/2007 |
| WO | WO 2008/020543 A1 | 2/2008 |
| WO | WO 2011/068105 A1 | 6/2011 |

\* cited by examiner

MOLD RELEASE FILM, PROCESS FOR ITS PRODUCTION, AND PROCESS FOR PRODUCING SEMICONDUCTOR PACKAGE

TECHNICAL FIELD

The present invention relates to a mold release film to be disposed on the cavity surface of a mold in the production of a semiconductor package by disposing a semiconductor element in the mold and sealing it with a curable resin to form a resin sealed portion, a process for producing the mold release film, and a process for producing a semiconductor package by using the mold release film.

BACKGROUND ART

A semiconductor chip is usually sealed with a resin for shielding and protection from outside air, and mounted on a substrate as a molded product called a package. For sealing a semiconductor chip, a curable resin such as a thermosetting resin such as an epoxy resin is used. As the method for sealing a semiconductor chip, for example, a so-called transfer molding method or compression molding method is known wherein a substrate having a semiconductor chip mounted thereon is disposed so that the semiconductor chip is positioned at a predetermined location in the cavity of a mold, and a curable resin is filled into the mold and cured.

Heretofore, a package is molded as a package molded article for each chip which is connected via a runner which is a flow path of a curable resin. In such a case, a mold release film may sometimes be used for the purpose of improving releasability of the package from the mold.

The mold release film is useful also with a view to preventing sticking of a curable resin to the mold. However, in the sealing step of a semiconductor element, even if a mold release film is disposed, there is a problem such that gas (outgas) and a low viscosity material generated from the curable resin will pass through the mold release film and will be in contact with the high temperature mold to contaminate the mold. If the mold contamination occurs, it is obliged to stop the sealing process of the semiconductor element in order to clean the mold, whereby production efficiency of the semiconductor package is reduced. In recent years, there have been advances in making the curable resin used for sealing to have a lower melt viscosity or to be a liquefied resin, whereby the above problem is more likely to occur.

In order to prevent the mold from contamination by outgassing, etc. from the cured resin, a mold release film having a metal foil or a vapor-deposited film of metal or metal oxide provided as a gas barrier layer, has been proposed (Patent Documents 1 to 3). Further, a mold release film having a resin film with high releasing property and a resin film with high gas barrier property (an ethylene-vinyl alcohol copolymer film, etc.) laminated, has been proposed (Patent Document 4).

PRIOR ART DOCUMENTS

Patent Documents

Patent Document 1: JP-A-2002-361643
Patent Document 2: JP-A-2004-79566
Patent Document 3: WO2007/125834
Patent Document 4: WO2008/020543

DISCLOSURE OF INVENTION

Technical Problem

However, the mold release film as described in Patent Documents 1 to 3 is insufficient in followability to the mold. Specifically, the mold release film is entirely stretched at the time of being vacuum suctioned to the mold in the sealing process, and largely deformed depending on a site. If the gas barrier layer is a metal foil, the gas barrier layer tends to be cracked when vacuum suctioned. If the gas barrier layer is a vapor-deposited film, although it may tend to be less cracked than a metal foil, if the deformation increases, the problem of cracking is likely to occur as in the case of the metal foil. If cracking occurs, the gas barrier property will be impaired, and it will be impossible to prevent contamination of the mold.

In the mold release film described in Patent Document 4, according to a study by the present inventors, pinholes may sometimes be formed at the time of letting it to follow the mold. If pinholes are formed in the mold release film, the gas barrier property will be impaired, and further, the curable resin, etc. tend to leak out from such a portion and adhere to the mold to cause mold release failure. Further, even if pinholes are not formed, contamination of the mold cannot be sufficiently suppressed.

An object of the present invention is to provide a mold release film which is excellent in mold releasing property and which is capable of reducing contamination of a mold in a sealing process of a semiconductor element, a process for its production, and a process for producing a semiconductor package by using the mold release film.

Solution to Problem

The present invention provides a mold release film, a process for its production and a process for producing a semiconductor package, having the following constructions [1] to [15].

[1] A mold release film to be disposed on a surface of a mold which is to be in contact with a curable resin, in the production of a semiconductor package by disposing a semiconductor element in the mold, and sealing it with the curable resin to form a resin sealed portion, characterized by comprising a resin-side release layer to be in contact with the curable resin at the time of forming the resin sealed portion, and a gas barrier layer, wherein the gas barrier layer comprises at least one polymer (I) selected from the group consisting of a polymer having vinyl alcohol units and a polymer having vinylidene chloride units, and the thickness of the gas barrier layer is from 0.1 to 5 μm.

[2] The mold release film according to [1], wherein the polymer (I) contains a polymer having vinyl alcohol units, and the polymer having vinyl alcohol units is a polyvinyl alcohol, or a polymer comprising vinyl alcohol units and vinyl acetate units.

[3] The mold release film according to [2], wherein the polymer having vinyl alcohol units is a polymer which further contains units other than vinyl alcohol units and vinyl acetate units.

[4] The mold release film according to [3], wherein the units other than vinyl alcohol units and vinyl acetate units, are units represented by the following formula (1):

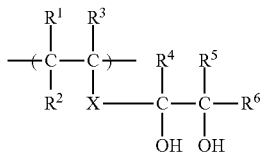
(1)

wherein $R^1$ to $R^6$ are each independently a hydrogen atom or a monovalent organic group, and X is a single bond or a bonding chain.

[5] The mold release film according to any one of [1] to [4], wherein the polymer (I) contains a polymer having vinyl alcohol units, and the polymer having vinyl alcohol units, has a crosslinked structure.

[6] The mold release film according to [5], wherein the insolubility degree of the gas barrier layer obtainable by the following formula from the basis weight W1 ($g/m^2$) of the gas barrier layer and the basis weight W2 ($g/m^2$) of the gas barrier layer remaining after subjecting the mold release film to the following dissolution test, is from 10 to 80%:

Insolubility degree (%)=(W2/W1)×100

Dissolution Test

The mold release film is heated for 1 hour by immersing it in ion-exchanged water of 80° C., during which stirring for 1 minute is repeated at 30 minutes intervals; the mold release film after completion of the heating for 1 hour, is washed by immersing it in another ion-exchanged water of 80° C. for 10 minutes; the mold release film after the washing, is immersed in ion-exchanged water of from 20 to 25° C. for 10 minutes to carry out washing and cooling; and the mold release film after the washing and cooling, is vacuum-dried at 100° C. for 2 hours.

[7] The mold release film according to any one of [1] to [6], wherein the thickness of the resin-side release layer is from 12 to 100 μm.

[8] The mold release film according to any one of [1] to [7], wherein the resin side release layer contains a fluororesin.

[9] The mold release film according to [8], wherein the fluororesin is an ethylene-tetrafluoroethylene copolymer.

[10] The mold release film according to any one of [1] to [9], wherein the mold release film is a film having a two-layer structure of the resin-side release layer and the gas barrier layer.

[11] A process for producing the mold release film as defined in any one of [1] to [10], characterized by comprising a step of forming a gas barrier layer on one surface of a substrate containing a resin-side release layer, wherein the step of forming a gas barrier layer includes a step of forming a coating film by applying a gas barrier layer-forming coating liquid comprising at least one polymer (I) selected from the group consisting of a polymer having vinyl alcohol units and a polymer having vinylidene chloride units, and a liquid medium, followed by drying.

[12] The process for producing the mold release film according to [11], wherein the gas barrier layer-forming coating liquid further contains a crosslinking agent, and the step of forming a gas barrier layer further includes, after the step of forming a coating film, a step of forming a cross-linked structure by crosslinking the polymer (I).

[13] The process for producing the mold release film according to [12], wherein the content of the crosslinking agent is from 1 to 20 mass % to the polymer (I).

[14] The process for producing the mold release film according to any one of [11] to [13], wherein the polymer (I) contains a polymer having vinyl alcohol units, and the liquid medium is an aqueous medium.

[15] A process for producing a semiconductor package having a semiconductor element and a resin sealed portion formed from a curable resin to seal the semiconductor element, characterized by comprising a step of disposing the mold release film as defined in any one of [1] to [10], on a surface of a mold which is to be in contact with a curable resin, a step of disposing a substrate having a semiconductor element mounted thereon, in the mold, and filling a curable resin in a space in said mold, followed by curing to form a resin sealed portion, thereby to obtain a sealed body having the substrate, the semiconductor element and the resin sealed portion, and a step of releasing the sealed body from the mold.

Advantageous Effects of Invention

According to the mold release film of the present invention, the mold releasing property will be excellent, and it is possible to reduce contamination of a mold in a step of sealing a semiconductor element.

According to the process for producing the mold release film of the present invention, it is possible to produce a mold release film which is excellent in mold releasing property and which is capable of reducing contamination of a mold in a step of sealing a semiconductor element.

According to the process for producing a semiconductor package of the present invention, it is possible to reduce contamination of a mold in the sealing step.

DESCRIPTION OF EMBODIMENTS

The following definitions of terms apply throughout the present specification including claims.

A "unit" in a polymer constituting a resin represents a constituting unit derived from a monomer in the polymer, as formed by polymerization of the monomer. A unit may be a unit formed directly by polymerization, or may be a unit having a part of the structure of the unit converted to another structure by chemical transformation of the polymer obtained by polymerization. A unit formed directly by polymerization of a monomer will be referred to also as a "unit based on a monomer".

A "fluororesin" means a resin containing fluorine atoms in its structure.

The mold release film of the present invention is a film to be disposed on the surface of a mold to be in contact with a curable resin in the production of a semiconductor package by disposing a semiconductor element in the mold and sealing it with the curable resin to form a resin sealed portion. The mold release film of the present invention is disposed, for example, at the time of forming a resin sealed portion of a semiconductor package, to cover the cavity surface of a mold having a cavity of a shape corresponding to the shape of the resin sealed portion, and by being disposed between the formed resin sealed portion and the mold cavity surface, release of the obtained semiconductor package from the mold, will be facilitated.

Now, the mold release film of the present invention will be described in detail.

Mold Release Film in First Embodiment

Figure 1:
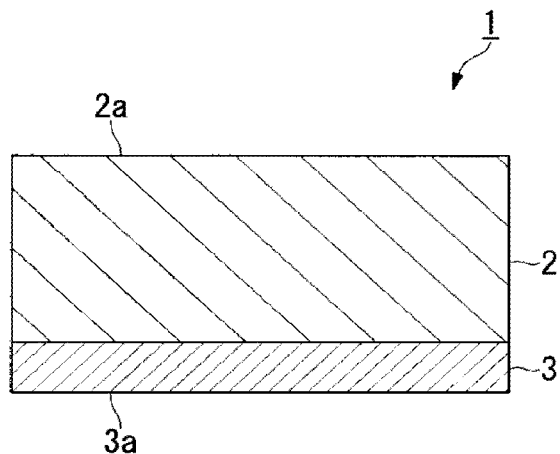
FIG. 1 is a schematic cross-sectional view showing a first embodiment of the mold release film of the present invention.

FIG. 1 is a schematic cross-sectional view showing a first embodiment of the mold release film of the present invention.

The mold release film 1 in the first embodiment comprises a resin-side release layer 2 to be in contact with a curable resin at the time of forming a resin sealed portion, and a gas barrier layer 3.

The mold release film 1 is disposed, at the time of producing a semiconductor package, so that the surface 2a of the resin-side release layer 2 side faces the cavity of a mold, and will be in contact with a curable resin at the time of forming a resin sealed portion. Further, at that time, the surface 3a of the gas barrier layer 3 side will be in close contact with the cavity surface of the mold. By curing the curable resin in this state, a resin sealed portion having a shape corresponding to the shape of the cavity of the mold will be formed.

Resin Side Release Layer

As the resin-side release layer 2, a layer comprising a resin with releasing property may be mentioned.

A resin with releasing property is such a resin that a layer composed solely of that resin can function as a release layer. As the resin with releasing property, a fluororesin, polymethyl pentene, syndiotactic polystyrene, silicone rubber, etc. may be mentioned. Among them, from the viewpoint of particularly high heat resistance, and less outgassing during heating, preferred is a fluororesin, polymethyl pentene, or syndiotactic polystyrene, and particularly preferred is a fluororesin. One type of these resins may be used alone, or two or more types may be used in combination.

As the fluororesin, from the viewpoint of releasing property and heat resistance, preferred is a fluoroolefin-type polymer. A fluoroolefin-type polymer is a polymer having units based on a fluoroolefin. A fluoroolefin-type polymer may further contain units other than units based on a fluoroolefin.

The fluoroolefin may, for example, be tetrafluoroethylene (hereinafter referred to also as "TFE"), vinyl fluoride, vinylidene fluoride, trifluoroethylene, hexafluoropropylene, chlorotrifluoroethylene, etc. As the fluoroolefin, one type may be used alone, or two or more types may be used in combination.

The fluoroolefin-type polymer may, for example, be an ethylene-tetrafluoroethylene copolymer (ETFE), a tetrafluoroethylene-hexafluoropropylene copolymer (FEP), a tetrafluoroethylene-perfluoro(alkyl vinyl ether) copolymer (PFA), a tetrafluoroethylene-hexafluoropropylene-vinylidene fluoride copolymer (THV), etc. As the fluoroolefin-type polymer, one type may be used alone, or two or more types may be used in combination.

As the fluoroolefin-type polymer, from the viewpoint of large elongation at a high temperature, ETFE is particularly preferred. ETFE is a copolymer having units based on TFE (hereinafter referred to also as "TFE units") and units based on ethylene (hereinafter referred to also as "E units").

As ETFE, preferred is a polymer having TFE units, E units and units based on a monomer other than TFE and ethylene (hereinafter referred to also as a "third monomer"). By selecting the type and content of the units based on the third monomer, it is easy to adjust the crystallinity of ETFE, and consequently the tensile characteristics of the resin-side release layer 2. For example, by having the units based on the third monomer (especially a monomer having a fluorine atom), the tensile strength and elongation at high temperatures (particularly around 180° C.) will be improved.

The third monomer may, for example, be a monomer having a fluorine atom, or a monomer having no fluorine atom.

As the monomer having a fluorine atom, the following monomers (a1) to (a5) may be mentioned.

Monomer (a1): a $C_2$ or $C_3$ fluoroolefin compound.

Monomer (a2): a perfluoroalkylethylene represented by the formula $X(CF_2)_nCY=CH_2$ (wherein X and Y are each independently a hydrogen atom or a fluorine atom, and n is an integer of from 2 to 8).

Monomer (a3): a fluoro vinyl ether compound.

Monomer (a4): a functional group-containing fluoro vinyl ether compound.

Monomer (a5): a fluorinated monomer having an aliphatic ring structure.

The monomer (a1) may, for example, be a fluoroethylene compound (trifluoroethylene, vinylidene fluoride, vinyl fluoride, chlorotrifluoroethylene, etc.), a fluoropropylene compound (hexafluoropropylene (hereinafter referred to also as "HFP") 2-hydropentafluoropropylene, etc.), etc.

As the monomer (a2), a monomer wherein n is from 2 to 6, is preferred, and a monomer wherein n is from 2 to 4, is particularly preferred. Further, a monomer wherein X is a fluorine atom, and Y is a hydrogen atom, i.e., a (perfluoroalkyl)ethylene, is particularly preferred.

Specific examples of the monomer (a2) include the following compounds.

$CF_3CF_2CH\!=\!CH_2$,
$CF_3CF_2CF_2CF_2CH\!=\!CH_2$ ((perfluorobutyl)ethylene, hereinafter referred to also as "PFBE"),
$CF_3CF_2CF_2CF_2CF\!=\!CH_2$,
$CF_2HCF_2CF_2CF\!=\!CH_2$,
$CF_2HCF_2CF_2CF_2CF\!=\!CH_2$, etc.

Specific examples of the monomer (a3) include the following compounds. Here, among the following ones, a monomer which is a diene, is a cyclopolymerizable monomer.

$CF_2\!=\!CFOCF_3$,
$CF_2\!=\!CFOCF_2CF_3$,
$CF_2\!=\!CF(CF_2)_2CF_3$ (perfluoro(propyl vinyl ether), hereinafter referred to also as PPVE),
$CF_2\!=\!CFOCF_2CF(CF_3)O(CF_2)_2CF_3$,
$CF_2\!=\!CFO(CF_2)_3O(CF_2)_2CF_3$,
$CF_2\!=\!CFO(CF_2CF(CF_3)O)_2(CF_2)_2CF_3$,
$CF_2\!=\!CFOCF_2CF(CF_3)O(CF_2)_2CF_3$,
$CF_2\!=\!CFOCF_2CF\!=\!CF_2$,
$CF_2\!=\!CFO(CF_2)_2CF\!=\!CF_2$, etc.

Specific examples of the monomer (a4) include the following compounds.

$CF_2\!=\!CFO(CF_2)_3CO_2CH_3$,
$CF_2\!=\!CFOCF_2CF(CF_3)O(CF_2)_3CO_2CH_3$,
$CF_2\!=\!CFOCF_2CF(CF_3)O(CF_2)_2SO_2F$, etc.

Specific examples of the monomer (a5) include perfluoro (2,2-dimethyl-1,3-dioxole), 2,2,4-trifluoro-5-trifluoromethoxy-1,3-dioxole, perfluoro(2-methylene-4-methyl-1,3-dioxolane), etc.

The monomer having no fluorine atom includes the following monomers (b1) to (b4).

Monomer (b1): an olefin compound.
Monomer (b2): a vinyl ester compound.
Monomer (b3): a vinyl ether compound.
Monomer (b4): an unsaturated acid anhydride.

Specific examples of the monomer (b1) include propylene, isobutene, etc.

Specific examples of the monomer (b2) include vinyl acetate, etc.

Specific examples of the monomer (b3) include ethyl vinyl ether, butyl vinyl ether, cyclohexyl vinyl ether, hydroxybutyl vinyl ether, etc.

Specific examples of the monomer (b4) include maleic anhydride, itaconic anhydride, citraconic anhydride, himic anhydride (5-norbornene-2,3-dicarboxylic acid anhydride), etc.

As the third monomer, one type may be used alone, or two or more types may be used in combination.

As the third monomer, from such a viewpoint that the degree of crystallinity can easily be adjusted, and tensile strength and elongation at high temperatures (particularly around 180° C.) will be excellent by having units based on the third monomer (especially a monomer having a fluorine atom), preferred is a monomer (a2), HFP, PPVE, or vinyl acetate, more preferred is HFP, PPVE, $CF_3CF_2CH\!=\!CH_2$ or PFBE, and particularly preferred is PFBE. That is, as ETFE, particularly preferred is a copolymer having TFE units, E units and units based on PFBE.

In ETFE, the molar ratio of TFE units to E units (TFE units/E units) is preferably from 80/20 to 40/60, more preferably from 70/30 to 45/55, particularly preferably from 65/35 to 50/50. When TFE units/E units is within the above range, ETFE will be excellent in heat resistance and mechanical strength.

The proportion of units based on the third monomer in ETFE is preferably from 0.01 to 20 mol %, more preferably from 0.10 to 15 mol %, particularly preferably from 0.20 to 10 mol %, to the total (100 mol %) of all units constituting ETFE. When the proportion of the units based on the third monomer is within the above range, ETFE will be excellent in heat resistance and mechanical strength.

In a case where the units based on the third monomer contain units based on PFBE, the proportion of the units based on PFBE is preferably from 0.5 to 4.0 mol %, more preferably from 0.7 to 3.6 mol %, particularly preferably from 1.0 to 3.6 mol %, based on the total (100 mol %) of all units constituting ETFE. When the proportion of the units based on PFBE is within such a range, it is possible to adjust the tensile modulus at 180° C. of the mold release film in the above-mentioned range. Further, the tensile strength and elongation at high temperatures (in particular around 180° C.) will be improved.

The melt flow rate (MFR) of ETFE is preferably from 2 to 40 g/10 min, more preferably from 5 to 30 g/10 min, particularly preferably from 10 to 20 g/10 min. MFR is an index for the molecular weight, and the larger the MFR, the smaller the molecular weight tends to be. When MFR of ETFE is within the above range, the moldability of ETFE will be improved, and the mold release film will be excellent in mechanical strength.

MFR of ETFE is a value to be measured in accordance with ASTM D3159 under a load of 49 N at 297° C.

The resin-side release layer 2 may be made solely of the above resin, or may further contain, in addition to the above resin, additives such as inorganic additives, organic additives, etc. The inorganic additives may, for example, be inorganic fillers, such as carbon black, silica, titanium oxide, cerium oxide, aluminum cobalt oxide, mica, zinc oxide, etc. The organic additives may, for example, be silicone oils, metal soaps, etc.

From the viewpoint of mold followability, the resin-side release layer 2 preferably contains no inorganic filler.

The resin-side release layer 2 is preferably a layer containing a fluororesin, particularly preferably a layer consisting solely of a fluororesin. In such a case, the mold release film 1 will be excellent in releasing property, will also sufficiently have resistance to withstand the temperature of the mold during molding (typically from 150 to 180° C.), strength to withstand the flow and pressure of a curable resin, etc. and will be excellent also in elongation at a high temperature.

Of the resin-side release layer 2, the surface to be in contact with a curable resin at the time of forming a resin-sealed portion, i.e. the surface 2a of the resin-side release layer 2 of the mold release film 1, may be smooth, or may have irregularities formed. From the viewpoint of the releasing property, it is preferred that irregularities are formed.

In the case where the surface is smooth, the arithmetic mean roughness (Ra) of the surface 2a is preferably from 0.01 to 0.2 μm, particularly preferably from 0.05 to 0.1 μm.

In the case where irregularities are formed, Ra of the surface 2a is preferably from 1.0 to 2.1 μm, particularly preferably from 1.2 to 1.9 μm.

The arithmetic mean roughness (Ra) is a value to be measured in accordance with JIS B0601: 2013 (ISO4287: 1997, Amd.1: 2009). The standard length lr (cut-off value lnc) for the roughness curve is set to be 0.8 mm.

The surface state when irregularities are formed may be a state where a plurality of protrusions and/or recesses are randomly distributed, or may be a state where a plurality of protrusions and/or recesses are regularly arranged. Shapes and sizes of the plurality of protrusions and/or recesses may be the same or different.

The protrusions may, for example, be elongated ridges extending or projections scattered on the surface of the mold release film, and the recesses may, for example, be elongated grooves extending or holes scattered on the surface of the mold release film.

The shapes of ridges or grooves may, for examples, be lines, curves, bent shapes. etc. On the mold release film surface, a plurality of ridges or grooves may be present in parallel to form stripes. Of ridges or grooves, the cross-sectional shapes in the direction perpendicular to the longitudinal direction may, for example, be polygonal such as triangular (V-shape), semi-circular, etc.

The shapes of the protrusions or holes may, for example, be polygonal pyramid shaped, such as triangular pyramid shaped, square pyramid shaped, hexagonal pyramid shaped, etc., conical, hemispherical, polyhedral, other various irregular shapes, etc.

The thickness of the resin-side release layer 2 is preferably from 12 to 100 μm, particularly preferably from 25 to 75 μm. When the thickness of the resin-side release layer 2 is at least the lower limit value in the above range, handling (for example, treatment by roll-to-roll) of the mold release film 1 will be easy, and wrinkles will be less likely to be formed at the time of disposing, while pulling, the mold release film 1 so as to cover the mold cavity. When the thickness of the resin-side release layer 2 is at most the upper limit value in the above range, it is possible to suppress generation of outgas during heating from the resin side release layer 2 itself, and the effect to reduce contamination of the mold will be more excellent. Further, the release film 1 can be easily deformed and thus will be excellent in mold followability.

Gas Barrier Layer

The gas barrier layer 3 comprises at least one polymer (I) selected from the group consisting of a polymer having vinyl alcohol units (hereinafter referred to also as a "polymer (A)") and a polymer having vinylidene chloride units (hereinafter referred to also as a "polymer (B)").

Here, "vinyl alcohol units" are units having acetoxy groups in vinyl acetate units converted to hydroxy groups by chemically converting a polymer obtained by polymerization of vinyl acetate.

The polymer (I) may have, or may not have, a crosslinked structure.

The polymer (A) may consist solely of vinyl alcohol units, or may be one further containing units other than vinyl alcohol units.

The proportion of vinyl alcohol units in the polymer (A) is preferably at least 60 mol %, more preferably at least 70 mol %, particularly preferably at least 80 mol %, to the total of all units. When the proportion of vinyl alcohol units is at least the above lower limit value, the gas barrier layer 3 will be more excellent in the gas barrier property.

As the polymer (A), the following polymer (A1) or polymer (A2) may be mentioned.

Polymer (A1): a polymer having vinyl alcohol units and having no crosslinked structure.

Polymer (A2): a polymer having vinyl alcohol units and having a crosslinked structure.

The polymer (A1) may consist solely of vinyl alcohol units, or may be one further containing units other than vinyl alcohol units.

The polymer (A1) may, for example, be a polyvinyl alcohol (hereinafter referred to also as "PVA"), a copolymer having vinyl alcohol units and units other than vinyl alcohol units and vinyl acetate units (hereinafter referred to also as "copolymer (A11)"), etc. The copolymer (A11) may further contain vinyl acetate units. One of these polymers may be used alone, or two or more of them may be used in combination.

PVA is a polymer composed solely of vinyl alcohol units, or may be a polymer composed of vinyl alcohol units and vinyl acetate units.

PVA may, for example, be a completely saponified product of polyvinyl acetate (degree of saponification: at least 99 mol % to 100 mol %), a quasi-completely saponified product (saponification degree: at least 90 mol % and less than 99 mol %), a partially saponified product (a saponification degree: at least 70 mol % and less than 90 mol %), etc.

The saponification degree of PVA is preferably from 80 to 100 mol %, more preferably from 85 to 100 mol %, particularly preferably from 90 to 100 mol %. The higher the degree of saponification, the higher the gas barrier property of the gas barrier layer 3 tends to be.

The degree of saponification is one having the proportion of acetoxy groups contained in polyvinyl acetate as raw material for PVA changed to hydroxy groups by saponification, represented by a unit ratio (mol %), and is defined by the following formula. The degree of saponification can be obtained by the method defined in JIS K6726: 1994.

Degree of saponification (mol %)={(number of hydroxy groups)/(number of hydroxy groups+ number of acetoxy groups)}×100

Other units in the copolymer (A11) may, for example, be units having a dihydroxy alkyl group, an acetoacetyl group, an oxyalkylene group, a carboxy group, an alkoxycarbonyl group, etc., units derived from an olefin such as ethylene, etc. Other units in the copolymer (A11) may be of one type, or of two or more types.

The units having a dihydroxy alkyl group may, for example, be 1,2-diol structural units represented by the following formula (1).

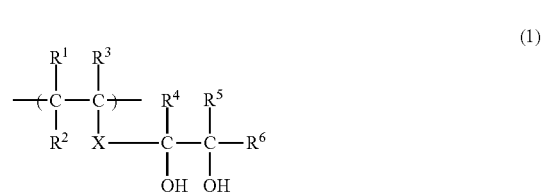

In the formula (1), $R^1$ to $R^6$ are each independently a hydrogen atom or a monovalent organic group.

$R^1$ to $R^6$ are preferably all hydrogen atoms, but may be monovalent organic groups so long as they are in such an amount not to impair resin properties significantly. The organic group is not particularly limited, but, for example, preferred is a $C_{1-4}$ alkyl group such as a methyl group, an ethyl group, a n-propyl group, an isopropyl group, a n-butyl group, an isobutyl group, a tert-butyl group, etc., and it may have, as the case requires, a substituent such as a halogen group, a hydroxy group, an ester group, a carboxylic acid group, a sulfonic acid group, etc.

In the formula (1), X is a single bond or a bonding chain. With a view to improving crystallinity or reducing intermolecular voids at amorphous portions, it is preferably a single bond.

The bonding chain is not particularly limited, and may, for example, be a hydrocarbon group such as an alkylene group, an alkenylene group, an alkynylene group, a phenylene group, a naphthylene group, etc. (such a hydrocarbon group may be substituted by halogen such as fluorine, chlorine, bromine, etc.), —O—, —(CH$_2$O)$_m$—, —(OCH$_2$)$_m$—, —(CH$_2$O)$_m$CH$_2$—, —CO—, —COCO—, —CO(CH$_2$)$_m$CO—, —CO(C$_6$H$_4$)CO—, —S—, —CS—, —SO—, —SO$_2$—, —NR$^7$—, —CONR$^7$—, —NR$^7$CO—, —CSNR$^7$, —NR$^7$CS—, —NR$^7$NR$^7$—, —HPO$_4$—, —Si(OR$^7$)$_2$—, —OSi(OR$^7$)$_2$—, —OSi(OR$^7$)$_2$O—, —OTi(OR$^7$)$_2$—, —OTi(OR$^7$)$_2$O—, —Al(OR$^7$)—, —OAl(OR$^7$)—, —OAl(OR$^7$)O—, etc. (each R$^7$ independently is an optional substituent, preferably a hydrogen atom or an alkyl group, and m is a natural number). Among them, from the viewpoint of excellent viscosity stability and heat resistance at the time of the production, preferred is a C$_{1-6}$ alkylene group, and particularly preferred is a methylene group or —CH$_2$OCH$_2$—.

As the 1,2-diol structural unit represented by the formula (1), particularly preferred is a unit wherein R$^1$ to R$^6$ are all hydrogen atoms, and X is a single bond. That is, particularly preferred is a unit represented by the following formula (1a).

(1a)

The unit having an acetoacetyl group may, for example, be a unit of a structure having —CR$^4$(OH)—CR$^5$R$^6$(OH) in the above formula (1) substituted by —COCH$_2$COCH$_3$, and preferred is one wherein X is —O—.

The unit having an oxyalkylene group may, for example, be a unit of a structure having —CR$^4$(OH)—CR$^5$R$^6$(OH) in the above formula (1) substituted by —(R$^{21}$O)$_n$—R$^{22}$ (wherein R$^{21}$ is a C$_{2-5}$ alkylene group, R$^{22}$ is a hydrogen atom or a C$_{1-5}$ alkyl group, and n is an integer of from 1 to 5), and preferred is one wherein X is —O—.

The unit having a carboxy group may, for example, be a unit of a structure having —CR$^4$(OH)—CR$^5$R$^6$OH in the above formula (1) substituted by —COOH, and preferred is one wherein X is a single bond. As a specific example, an acrylic acid unit or a methacrylic acid unit may be mentioned.

The unit having an alkoxycarbonyl group may, for example, be a unit of a structure having —CR$^4$(OH)—CR$^5$R$^6$(OH) in the above formula (1) substituted by —COOR$^{23}$ (wherein R$^{23}$ is a C$_{1-5}$ alkyl group), and preferred is one wherein X is a single bond. As a specific example, a methyl acrylate unit or a methyl methacrylate unit may be mentioned.

The copolymer (A11) can be obtained, for example, by a method of reacting a modifier to PVA, or a method of saponifying a copolymer of vinyl acetate and another monomer.

Specific examples of the copolymer (A11) include a copolymer having vinyl alcohol units and units having a 1,2-diol structure, an acetoacetylated PVA (a copolymer having vinyl alcohol units and acetoacetyl groups), an alkylene oxide-modified PVA (a copolymer having polyvinyl alcohol units and oxyalkylene groups), a carboxylic acid-modified PVA (a copolymer having vinyl alcohol units and carboxy groups), a vinyl alcohol-acrylic acid-methyl methacrylate copolymer, an ethylene-vinyl alcohol copolymer, etc.

The preferred range of the degree of saponification of the copolymer (A11) is the same as PVA.

The content of other units in the copolymer (A11) is preferably from 2 to 30 mol %, particularly preferably from 5 to 20 mol %, to the total of all units.

As the copolymer (A11), preferred is a copolymer having vinyl alcohol units and 1,2-diol structural units represented by the above formula (1) (hereinafter referred to also as "copolymer (A11-1)").

The copolymer (A11-1) preferably has from 85 to 98 mol % in total of vinyl alcohol units and vinyl acetate units, and from 2 to 15 mol % of 1,2-diol structural units, more preferably has from 88 to 96 mol % in total of vinyl alcohol units and vinyl acetate units, and from 4 to 12 mol % of 1,2-diol structural units, particularly preferably has from 90 to 95 mol % in total of vinyl alcohol units and vinyl acetate units, and from 5 to 10 mol % of 1,2-diol structural units. The preferred range of the proportion of vinyl alcohol units in the total of vinyl alcohol units and vinyl acetate units, i.e. the degree of saponification, is the same as PVA.

The viscosity (20° C.) of a 4 mass % aqueous solution of the polymer (A1) is preferably from 2.5 to 100 MPa·s, more preferably from 3 to 70 MPa·s, particularly preferably from 5 to 60 MPa·s. When the viscosity is at least the lower limit value in the above range, there is a tendency that cracking is unlikely to occur in the gas barrier layer 3, and when it is at most the upper limit value in the above range, the working efficiency will be excellent at the time of forming a gas barrier layer 3 by applying a coating liquid containing the polymer (A1) and an aqueous medium.

Here, the above viscosity is one to be measured in accordance with JIS K6726: 1994.

The viscosity of a 4 mass % aqueous solution of the polymer (A1) can be adjusted by the molecular weight of the polymer (A1) or the saponification degree of the polymer (A1).

The polymer (A2) may, for example, be a polymer obtainable by reacting the polymer (A1) with a cross-linking agent. In a case where the polymer (A1) is self-crosslinkable one (e.g. acetoacetylated PVA) by e.g. heat, it may be one obtainable by letting the polymer (A1) be self-crosslinked.

The polymer (A1) to be reacted with the crosslinking agent may be the same as mentioned above, and is preferably PVA or the copolymer (A11), particularly preferably PVA or the copolymer (A11-1). That is, the polymer (A2) is preferably PVA or the copolymer (A11) having a crosslinked structure, particularly preferably PVA or the copolymer (A11-1) having a crosslinked structure.

The crosslinking agent is preferably a water-soluble crosslinking agent to form a crosslinked structure by a reaction with a hydroxy group. Specific examples include an organometallic compound, an isocyanate compound having two or more isocyanate groups, a bis vinyl sulfone compound, etc.

The organometallic compound may, for example, be an alkoxide compound, chelate compound, acylate compound, or the like, of a metal selected from the group consisting of titanium, aluminum, zirconium and tin. One of them may be used alone, or two or more of them may be used in combination.

The alkoxide compound may, for example, be a titanium alkoxide compound or the like, and a compound represented by the following formula (II) is preferred.

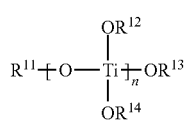

(II)

In the formula (II), $R^{11}$ to $R^{14}$ are each independently an alkyl group. $R^{11}$ to $R^{14}$ may be the same or may be different from each other. The number of carbon atoms in the alkyl group is preferably from 1 to 8.

n is an integer of from 1 to 10.

Specific examples of the titanium alkoxide compound represented by the formula (II) include tetraisopropyl titanate, tetra-n-propyl titanate, tetra-n-butyl titanate, tetra-t-butyl titanate, tetra-isobutyl titanate, tetraethyl titanate, tetra-isooctyl titanate, mixed alkyl titanates such as diisopropyl diisooctyl titanate and isopropyl tri isooctyl titanate, tetra-n-butyl titanate dimer, tetra-n-butyl titanate tetramer, etc., formed by condensation of tetraalkyl titanates, etc.

The chelating compound is preferably a titanium chelate compound having a structure in which a chelating agent is coordinated to the titanium alkoxide compound represented by the formula (II).

The chelating agent is not particularly limited, but preferred is at least one member selected from the group consisting of a β-diketone, a β-keto ester, a polyhydric alcohol, an alkanolamine and an oxy carboxylic acid, with a view to improving the stability to hydrolysis of the titanium compound.

The acylate compound may, for example, be a metal polyhydroxy stearate, bisacetylacetonate, tetraacetylacetonate, polyacetylacetonate, octylene glycolate, ethyl acetoacetate, lactate, etc.

As the isocyanate compound, a water-soluble compound is preferred. As the preferred structure, a compound of a biuret structure, an isocyanurate structure or an adduct structure, may be mentioned.

The bis-vinyl sulfone compound may, for example, be 1,2-bis(vinylsulfonyl)ethane, bis{2-(vinylsulfonyl)ethyl}ether, 1,5-bis(vinylsulfonyl)-3-hydroxy-pentane, 1,2-bis(vinylsulfonylacetamide)ethane, 1,3-bis(vinylsulfonylacetamide)propane, 1,5-bis(vinylsulfonyl)-3-methoxy-pentane, 1,8-bis(vinylsulfonyl)-3,6-dioxaoctane, bis{2-(1'-methyl vinyl sulfonyl)ethyl}ether, 1,2-bis{(1"-methyl vinyl sulfonyl)acetamide}ethane, 1,3 bis{(1'-vinyl sulfonyl)acetamide}propane, etc.

In a case where the crosslinking agent is the above metal alkoxide compound, chelate compound or acylate compound, for example, a crosslinked structural unit of $M(\text{—O—R})_n$ (wherein M represents a metal atom derived from e.g. the above-mentioned alkoxide compound, n is the valence of M and represents an integer of at least 2, and R represents a residue obtained by removing a hydroxy group from a vinyl alcohol unit) will be formed.

In a case where the crosslinking agent is an isocyanate compound, for example, a crosslinked structural unit of $R^{15}(\text{—NH—CO—O—R})_p$ (wherein $R^{15}$ represents a residue obtained by removing an isocyanate group from an isocyanate compound, p represents an integer of at least 2, and R represents a residue obtained by removing a hydroxy group from a vinyl alcohol unit) will be formed.

The degree of crosslinking of the polymer (A2) may be adjusted by e.g. the amount of the crosslinking agent, or the temperature at the time of reacting the polymer (A1) with the crosslinking agent, but varies substantially depending on the molecular structure of the crosslinking agent. The reactivity of the crosslinking agent is an isocyanate compound=a bis-vinyl sulfone compound<an organic zirconia compound<an organic titanate compound.

As the crosslinking agent, from the viewpoint of moderate reactivity, isocyanate compounds, or organic metal compounds are preferred. Among the organic metal compounds, an organic titanium compound, or an organic zirconium compound, is particularly preferred.

In a case where the polymer (A1) to be reacted with a crosslinking agent, has a crosslinkable functional group other than a hydroxy group, a crosslinking agent corresponding thereto may be used. As such a crosslinkable functional group, a carbonyl group, a carboxy group or an acetoacetyl group may be mentioned. As a crosslinking agent having such a crosslinkable functional group, dihydrazide compounds, diamine compounds, methylol compounds, dialdehyde compounds, etc. may be mentioned.

The polymer (B) may consist solely of vinylidene chloride units, or may be one further containing units other than the vinylidene chloride units.

The proportion of vinylidene chloride units in the polymer (A) is preferably at least 70 mol %, particularly preferably at least 80 mol %, to the total of all units. When the proportion of vinylidene chloride units is at least the above lower limit value, the gas barrier property of the gas barrier layer 3 will be more excellent.

As the polymer (B), the following polymer (B1) or polymer (B2) may be mentioned.

Polymer (B1): a polymer having vinylidene chloride units and no crosslinked structure.

Polymer (B2): a polymer having vinylidene chloride units and also crosslinked structures.

The polymer (B1) may, for example, be polyvinylidene chloride, a vinylidene chloride-alkyl acrylate copolymer, etc.

The polymer (B2) may, for example, be a polymer obtained by reacting the polymer (B1) with a cross-linking agent, etc.

As the crosslinking agent, preferred is a water-soluble crosslinking agent to form a crosslinked structure by a reaction with a halogen group or a functional group bonded to an alkyl acrylate. Specific examples thereof include organometallic compounds, isocyanate compounds having two or more isocyanate groups, bis vinyl sulfone compounds, etc. Specific examples of these crosslinking agents are the same as those described above.

From such a viewpoint that the gas barrier property will be more excellent, the polymer (A) in the gas barrier layer 3 preferably contains the polymer (A), more preferably contains PVA or the copolymer (A11), particularly preferably contains PVA or the copolymer (A11-1).

The polymer (A) in the gas barrier layer 3 may be the polymer (A1) or the polymer (A2), and from such a viewpoint that outgassing from the gas barrier layer 3 will be more reduced, and the effect to reduce contamination of the mold will be more excellent, the polymer (A2) is preferred, PVA or the copolymer (A11) having a crosslinked structure is more preferred, and PVA or the copolymer (A11-1) having a crosslinked structure is particularly preferred.

In a case where the polymer (I) in the gas barrier layer 3 contains the polymer (A), the insolubility degree of the gas barrier layer obtainable by the following formula from the basis weight W1 (g/m$^2$) of the gas barrier layer 3 and the basis weight W2 (g/m$^2$) of the gas barrier layer 3 remaining after subjecting the mold release film 1 to the following dissolution test, is preferably from 10 to 80%, particularly preferably from 30 to 80%:

$$\text{Insolubility degree (\%)} = (W2/W1) \times 100$$

The insolubility degree is an index for the crosslinked degree of the polymer (A). The higher the crosslinked degree of the polymer (A), the higher the insolubility degree. When the insolubility degree is at least the lower limit value in the above range, it is possible to prevent generation of gas from the gas barrier layer 3, and the effect to reduce contamination of the mold will be excellent. When the insolubility degree is at most the upper limit value in the above range, the gas barrier layer 3 is less likely to undergo cracking at the time of following the mold, and the effect to reduce contamination of the mold will be excellent.

The insolubility degree corresponds to the crosslinked degree of the polymer (A), and as mentioned above, the crosslinked degree may be adjusted, for example, by the type and amount of the crosslinking agent to be reacted with the polymer (A), the temperature at the time of reacting the polymer (A1) with a crosslinking agent, etc.

Dissolution Test

The mold release film is heated for 1 hour by immersing it in ion-exchanged water of 80° C. During the period, stirring for 1 minute is repeated at 30 minutes intervals. The mold release film after completion of the heating for 1 hour, is washed by immersing it in another ion-exchanged water of 80° C. for 10 minutes. The mold release film after the washing, is immersed in ion-exchanged water of from 20 to 25° C. for 10 minutes to carry out washing and cooling. The mold release film after the washing and cooling, is vacuum-dried at 100° C. for 2 hours.

The gas barrier layer 3 may contain components other than the polymer (I), as the case requires.

Such other components may, for example, be inorganic particles, antistatic agents, lubricants, etc.

The thickness of the gas barrier layer 3 is from 0.1 to 5 µm, preferably 0.5 to 3 µm. When the thickness of the gas barrier layer 3 is at least the lower limit value in the above range, it is possible to secure a sufficient gas barrier property, and the effect to reduce contamination of the mold will be excellent. When the thickness of the gas barrier layer 3 is at most the upper limit value in the above range, it is possible to reduce outgassing from the gas barrier layer itself, and the effect to reduce contamination of the mold will be excellent. Further, pinholes are unlikely to be formed, since the elongation properties of the resin-side release layer 2 will not be affected. Further, the economical efficiency will also be excellent.

Thickness of Mold Release Film

The thickness of the mold release film 1 is preferably from 25 to 100 µm, particularly preferably from 30 to 75 µm. When the thickness of the mold release film 1 is at least the lower limit value in the above range, it will be easy to handle the mold release film 1, and wrinkles will be less likely to be formed when the mold release film is disposed to cover the mold cavity, while pulling it. When the thickness of the mold release film 1 is at most the upper limit value in the above range, it is possible to suppress generation of outgas from the mold release film 1 itself at the time of heating it, and the effect to reduce contamination of the mold will be more excellent. Further, the mold release film 1 can be easily deformed, whereby it will be excellent in mold followability.

The thickness of the mold release film 1 should better be thin within the above range, as the mold cavity is large. Further, it should better be thin within the above range, as the mold is more complex with multiple cavities.

Permeability of Xylene Gas at the Time of Following a Difference in Level of 2 mm of Mold Release Film Of the mold release film 1, the permeability of xylene gas at the time of following a difference in level of 2 mm, as measured by the following measuring method, is preferably at most 20%, particularly preferably at most 10%. The lower the permeability, the better the effect to reduce contamination of the mold. The lower limit of the permeability is not particularly limited, but is, for example, at least 0.1%.

Method for Measuring Xylene Gas Permeability at the Time of Following a Difference in Level of 2 mm In a first container made of aluminum and having a concave with a diameter of 60 mm and a depth of 10 mm, 1.5 g of xylene is dropwise added. In a concave of a second container made of aluminum and having the same shape as the first container, a porous ceramic with a diameter of 60 mm and a thickness of 8 mm is fitted. Further, a drilled threaded hole is formed on the bottom surface of the concave, and a vacuum pump is connected thereto. On the first container, the second container is disposed so that the opening of the concave faces downward (the first container side), and the first container and the second container are joined in such a state that the mold release film and a flange are sandwiched between them, and are fixed by screws to obtain a test specimen. The entire mass (g) of the test specimen is measured by an electronic balance, and the measured value is taken as the mass before heating.

Then, the test specimen is placed on a hot plate heated to 180° C. and at the same time, the vacuum pump is switched on, followed by standing still for 15 minutes while maintaining the vacuum degree to be −100 kPa or lower. Upon expiration of 15 minutes, the vacuum pump is stopped and disconnected, whereupon the entire mass (g) of the test specimen is immediately measured, and the measured value is taken as the mass after heating. From the measurement results, the xylene gas permeability is calculated by the following formula $$\text{Xylene gas permeability (\%)} = \{(\text{the mass before heating} - \text{the mass after heating})/1.5\} \times 100$$

The measurement method will be described in more detail in Examples given below with reference to the drawings.

Mass Reduction Rate at 180° C. of Mold Release Film

Of the mold release film 1, the mass reduction rate at 180° C. as measured by the following measuring method, is preferably at most 0.15%, particularly preferably at most 0.1%. The lower the mass reduction rate, the less the outgassing from the mold release film 1 itself in the sealing step, and the better the effect to reduce contamination of the mold. The lower limit of the mass reduction rate is not particularly defined.

Method for Measuring the Mass Reduction Rate at 180° C.

A mold release film is cut out in a 10 cm square to prepare a test sample, the mass (mg) of the test sample is measured by using a balance, and the measured value is taken as the mass before heating.

Then, the test sample is sandwiched between two stainless plates of a 15 cm square with a thickness of 0.2 mm. This assembly is pressed for 20 minutes under conditions of 180° C. and 1 MPa. Thereafter, the test sample is taken out, the mass (mg) of the test sample is measured in the same manner as above, and the measured value is taken as the mass after heating.

From the measurement results, the mass reduction rate (%) is calculated based on the following formula.

Mass reduction rate (%)={(the mass before heating)−(the mass after heating)}/(the mass before heating)×100

Process for Producing Mold Release Film

As a process for producing a mold release film 1, the following production process is preferred.

A production process comprising a step of forming a gas barrier layer 3 on one surface of a resin film to form a resin-side release layer 2 (a substrate containing a resin-side release layer), wherein the step of forming a gas barrier layer 3 includes a step (hereinafter referred to also as "step (i)") of forming a coating film by applying a gas barrier layer-forming coating liquid comprising the polymer (I) and a liquid medium, followed by drying.

The gas barrier layer-forming coating liquid may further contain a crosslinking agent.

In a case where the gas barrier layer-forming coating liquid contains a crosslinking agent, the step of forming a gas barrier layer 3 preferably further contains, after the above-mentioned step of forming a coating film, a step of forming a crosslinked structure by crosslinking the polymer (I) (hereinafter referred to also as "step (ii)").

Resin Film

As the resin film for forming the resin-side release layer 2, a commercially available resin film may be used, or a resin film produced by a known production method may be used. The resin film may be one subjected to surface treatment such as corona treatment, plasma treatment, primer coating treatment, etc.

The method for producing the resin film is not particularly limited, and a known production method may be employed.

As a method for producing a resin film with both surfaces being smooth, for example, a method may be mentioned in which melt-molding is conducted by an extruder equipped with a T die having a predetermined lip width.

As a method for producing a resin film having irregularities formed on one side or both sides, for example, a method of transferring irregularities of an original mold to a surface of a resin film by thermal processing, may be mentioned, and from the viewpoint of productivity, the following method (1) or (2) is, for example, preferred. In the method (1) or (2), by using a roll-type original mold, continuous processing becomes possible, and the productivity of a resin film having irregularities formed, will be remarkably improved. In the method (1) or (2), if, as the impression cylinder roll, one having irregularities formed on its surface is used, a resin film having irregularities formed on both sides is obtainable.

(1) a method of passing a resin film between a cooling roll and a pressing roll, to continuously transfer irregularities formed on the surface of the pressing roll, to a surface of the resin film.

(2) a method of passing a resin extruded from a die of an extruder, between a cooling roll and a pressing roll, to mold the heated resin into a film-form and, at the same time, to continuously transfer irregularities formed on the surface of the pressing roll, to a surface of the film-form resin.

Here, in the method (1) or (2), if, as the cooling roll, one having irregularities formed on its surface is used, a resin film having irregularities formed on both sides is obtainable.

Gas Barrier Layer-Forming Coating Liquid

The polymer (I) and the crosslinking agent are, respectively, the same as described above.

The polymer (I) in the gas barrier layer-forming coating liquid, preferably has no crosslinked structure, from the viewpoint of coating properties of the gas barrier layer-forming coating liquid. That is, in the case of the polymer (A), the polymer (A1) is preferred, and in the case of the polymer (B), the polymer (B1) is preferred.

As the liquid medium, one to dissolve or disperse the polymer (I) in the gas barrier layer-forming coating liquid, is used, and one to dissolve the polymer (I), is preferred.

In a case where the polymer (I) in the gas barrier layer-forming coating liquid is a polymer (A), the liquid medium is preferably an aqueous medium.

The aqueous medium is a liquid medium containing at least water, and it may, for example, be water, or a mixed solvent of water and an organic solvent.

The organic solvent in the mixed solvent is preferably one having compatibility with water, and, for example, methanol, ethanol, propanol, isopropanol, etc. may be mentioned. One of these organic solvents may be used alone, or two or more of them may be used as mixed.

In a case where the polymer (I) in the gas barrier layer-forming coating liquid is a polymer (B), the liquid medium is preferably water.

In a case where the polymer (I) in the gas barrier layer-forming coating liquid is a mixture of the polymer (A) and the polymer (B), the liquid medium is preferably water.

The gas barrier layer-forming coating liquid may contain components other than the polymer (I) and the crosslinking agent. Such other components may be the same as the above-mentioned other components.

The content of the polymer (I) in the gas barrier layer-forming coating liquid is preferably from 2 to 15 mass %, particularly preferably from 5 to 12 mass %, to the total amount (100 mass %) of the gas barrier layer-forming coating liquid. When the content of the polymer (I) is at least the lower limit value in the above range, the film forming properties at the time of drying will be excellent, and when it is at most the upper limit value in the above range, the coating properties will be excellent.

The content of the crosslinking agent in the gas barrier layer-forming coating liquid is set in consideration of the crosslinking degree of the polymer (I) in the gas barrier layer 3. In a case where the gas barrier layer-forming coating liquid further contains a crosslinking agent, the content of the crosslinking agent in the gas barrier layer-forming coating liquid is preferably from 1 to 20 mass %, particularly preferably from 3 to 15 mass %, to the polymer (I). When the content of the crosslinking agent is at least the lower limit value in the above range, generation of gas from the gas barrier layer 3 itself can be suppressed, and the effect to reduce contamination of the mold will be excellent. When the content of the crosslinking agent is at most the upper limit value in the above range, the gas barrier layer 3 is less likely to undergo cracking at the time of following the mold, and the effect to reduce contamination of the mold will be excellent.

The gas barrier layer-forming coating liquid can be prepared by mixing the polymer (I) and the liquid medium, and, as the case requires, a crosslinking agent and other components.

Step of Forming Gas Barrier Layer

The step of forming a gas barrier layer 3 comprises the step (i) and, as the case requires, the step (ii).

In the step (i), the gas barrier layer-forming coating liquid is applied and dried to form a coating film.

As the coating method, a method known as a wet coating method may be used without any particular limitation. Specific examples include a spin coating method, a roll coating method, a casting method, a dipping method, a water casting method, a Langmuir-Blodgett method, a die coating method, an inkjet method, a spray coating method, etc.

Drying may be carried out by air drying at room temperature, or may be carried out by heating and baking. The baking temperature is preferably at least the boiling point of the liquid solvent.

In the step (ii), the polymer contained in the coating film formed in the step (i) is crosslinked to form a crosslinked structure. Such crosslinking of the polymer maybe carried out, for example, by a method of baking the coating film, or a method of irradiating the coating film with ultraviolet rays or electron beams.

In the case of the method of baking the coating film, the baking temperature is preferably from 40 to 60° C. When it is at least 40° C., the cross-linking reaction of the coating film will proceed sufficiently, and when it is at most 60° C., deterioration of the coating film or the substrate will be less. The baking integration time (temperature (° C.)×time (hours)) is preferably at least 4,800.

The drying process in the step (i) may also serve as the step (ii).

Advantageous Effects

By the mold release film 1, as it has the gas barrier layer 3, it is possible to reduce contamination of the mold in a sealing step of a semiconductor element.

Heretofore, a mold release film obtained by laminating a resin film with high releasing property and a resin film with high gas barrier property has been proposed, and the resin film with high gas barrier property may, for example, be a PET film, a readily moldable PET film, a nylon film, an ethylene-vinyl alcohol copolymer film, etc. However, in such a case, from the viewpoint of the handling efficiency, the thickness of the resin film with high gas barrier property becomes at least 10 µm. As the thickness is at least 10 µm, the gas barrier property will be provided, but the resin contained in the resin film is not necessarily high in heat resistance, and when it is exposed to a high temperature in the sealing step, a large amount of out gas has been formed from the gas barrier layer itself, which has thus led to a contradictory phenomenon such that the gas barrier layer itself has contaminated the mold.

In the present invention, as the thickness of the gas barrier layer 3 is thin at a level of at most 5 µm, and thus, the amount of the resin causing outgassing is less. Therefore, as compared with the conventional one, the amount of outgas generated from the gas barrier layer 3 itself is less, whereby it is possible to reduce contamination of the mold. Especially when the polymer (I) has a crosslinked structure, as compared with the case not having a crosslinked structure, the heat resistance is high, and the amount of generated outgas is less.

Further, in the present invention, as the gas barrier layer 3 contains the polymer (I), even if it is thin, it has a sufficient gas barrier property. Further, the gas barrier layer 3 is excellent in stretchability, whereby when the mold release film 1 is permitted to follow the mold, the gas barrier layer 3 is less likely to undergo cracking, or pin holes are less likely to be formed in the mold release film 1. Thus, even after following the mold, the excellent gas barrier property is maintained. Therefore, outgas, etc. generated from a curable resin in the sealing step is less likely to pass through the mold release film 1, and it is possible to reduce contamination of the mold by the outgas, etc. Also, mold release failure to be caused by leakage of the curable resin, etc. from the pinholes, or sticking of them to the mold, is less likely to occur, and after curing of the curable resin, it is possible to satisfactorily release the sealed body having a resin-sealed portion, thereby formed.

Mold Release Film in Second Embodiment

Figure 2:
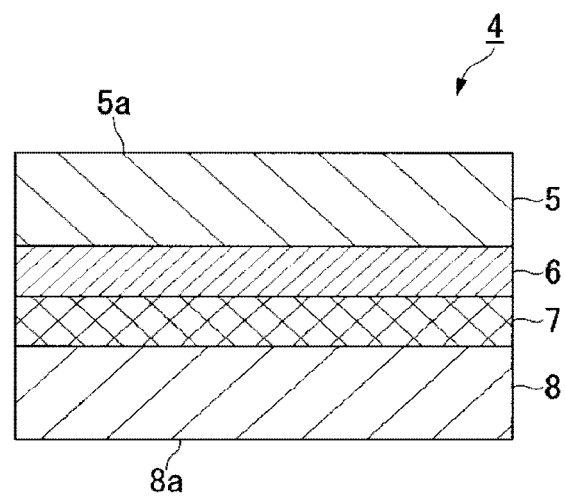
FIG. 2 is a schematic cross-sectional view showing a second embodiment of the mold release film of the present invention.

FIG. 2 is a schematic cross-sectional view showing a second embodiment of the mold release film of the present invention.

The mold release film 4 in the second embodiment comprises a resin-side release layer 5 to be in contact with a curable resin at the time of forming a resin sealed portion, a gas barrier layer 6, an adhesive layer 7, and a mold-side release layer 8 to be in contact with the mold at the time of forming the resin-sealed portion. The mold release film 4 is one having such a structure that on the gas barrier layer 3 side of the mold release film 1 in the first embodiment, the mold-side release layer 8 is laminated via the adhesive layer 7.

At the time of production of a semiconductor package, the mold release film 4 is disposed so that the surface 5a on the resin-side release layer 5 side, faces the cavity of the mold and will be in contact with a curable resin at the time of forming a resin-sealed portion. Further, at that time, the surface 8a on the mold-side release layer side will be in close contact with the cavity surface of the mold. By curing the curable resin in this state, a resin-sealed portion of a shape corresponding to the shape of the cavity of the mold will be formed.

Resin-Side Release Layer

The resin-side release layer 5 is the same as the resin-side release layer 2 in the first embodiment. Except for the thickness, the preferred embodiment is also the same.

The thickness of the resin-side release layer 5 is preferably from 12 to 50 µm, particularly preferably from 25 to 50 µm. When the thickness of the resin-side release layer 5 is at least the lower limit value in the above range, handling (for example, handling by roll-to-roll) of the mold release film 4 will be easy, and wrinkles will be less likely to be formed at the time when the mold release film 4 is, while being pulled, disposed to cover the cavity of the mold. When the thickness of the resin-side release layer 5 is at most the upper limit value in the above range, it is possible to suppress generation of outgas during heating from the resin-side release layer 5 itself, and the effect to reduce contamination of the mold will be more excellent. Further, the release film 4 is easily deformable and thus is excellent in mold followability.

Gas Barrier Layer

The gas barrier layer 6 is the same as the gas barrier layer 3 in the first embodiment. The preferred embodiment is also the same.

Adhesive Layer

The adhesive layer 7 is a layer to improve the adhesion between the gas barrier layer 6 and the mold-side release layer 8.

The adhesive layer 7 may, for example, be a layer formed from an adhesive. The adhesive contains a base agent and a curing agent, and means one which will be cured e.g. by heating, to exhibit adhesion. The adhesive may be a one-part adhesive, or may be a two-part adhesive.

As the adhesive, one known as an adhesive for dry lamination may be used. For example, an adhesive, such as a polyvinyl acetate-type adhesive; a homopolymer or copolymer of an acrylic acid ester (ethyl acrylate, butyl acrylate, 2-ethylhexyl acrylate, etc.), or a polyacrylic acid ester-type adhesive made of a copolymer of an acrylic acid ester and another monomer (methyl methacrylate, acrylonitrile, styrene, etc.), etc.; a cyanoacrylate-type adhesive; an ethylene copolymer-type adhesive made of a copolymer of ethylene and another monomer (vinyl acetate, ethyl acrylate, acrylic acid, methacrylic acid, etc.), etc.; a cellulose-type adhesive; a polyester-type adhesive; a polyamide-type adhesive; a polyimide-type adhesive; an amino resin-type adhesive made of a urea resin or a melamine resin, etc.; a phenol resin-type adhesive; an epoxy-type adhesive; a polyurethane-type adhesive to let a polyol (a polyether polyol, a polyester polyol, etc.) be crosslinked with an isocyanate and/or isocyanurate; a reactive (meth)acrylic adhesive; a rubber-type adhesive made of chloroprene rubber, nitrile rubber, styrene-butadiene rubber, etc.; a silicone adhesive; an inorganic adhesive made of an alkali metal silicate, a low melting point glass, etc.; or other, may be used.

The thickness of the adhesive layer 7 is preferably from 0.1 to 1 μm, particularly preferably from 0.2 to 0.5 μm. When the thickness of the adhesive layer 7 is at least the lower limit value in the above range, the adhesion between the gas barrier layer 6 and the mold-side release layer 8 will be sufficiently excellent. When the thickness of the adhesive layer 7 is at most the upper limit value in the above range, it is possible to suppress generation of outgas during heating from the adhesive layer 7 itself, and the effect to reduce contamination of the mold will be more excellent.

Mold-Side Release Layer

The mold-side release layer 8 may be a layer comprising a resin with releasing property. As the resin with releasing property, a fluororesin, polymethyl pentene, syndiotactic polystyrene, a polyester, a polyamide, a silicone rubber, etc. may be mentioned.

The fluororesin may be the same as one mentioned in the description of the resin-side release layer 2.

As the polyester, from the viewpoint of heat resistance and strength, preferred is polyethylene terephthalate (hereinafter referred to also as "PET"), easily moldable PET, polybutylene terephthalate (hereinafter referred to also as "PBT"), or polynaphthalene terephthalate.

The easily moldable PET is one having the moldability improved by copolymerizing, in addition to ethylene glycol and terephthalic acid (or dimethyl terephthalate), other monomer(s). Specifically, it is PET having a glass transition temperature Tg of at most 105° C. as measured by the following method.

Tg is a temperature at which tan δ (E"/E') being a ratio of loss modulus E" to storage elastic modulus E' to be measured based on ISO6721-4: 1994 (JIS K7244-4: 1999) takes the maximum value. Tg is measured by raising the temperature from 20° C. to 180° C. at a rate of 2° C./min. and setting the frequency to be 10 Hz, the static force to be 0.98 N and the dynamic displacement to be 0.035%.

As the polyamide, from the viewpoint of the heat resistance, strength and gas barrier property, preferred is nylon 6, or nylon MXD6. The polyamide may be a stretched one, or one not stretched.

As the resin to be contained in the mold-side release layer 8, among them, preferred is a fluororesin, polymethyl pentene or syndiotactic polystyrene, and particularly preferred is a fluororesin.

The mold-side release layer 8 may be made solely of the above resin, or may further contain, in addition to the above resin, additives such as inorganic additives, organic additives, etc. The inorganic additives may, for example, be inorganic fillers, such as carbon black, silica, titanium oxide, cerium oxide, aluminum cobalt, mica, zinc oxide, etc. The organic additives may, for example, be silicone oils, metal soaps, etc.

From the viewpoint of the mold followability, the mold-side release layer 8 preferably contains no inorganic filler.

Of the mold-side release layer 8, the surface to be in contact with the mold at the time of forming the resin sealed portion, i.e. the surface 8a on the mold-side release layer 8 side of the mold release film 4, may be smooth, or may have irregularities formed. From the viewpoint of the releasing property, it is preferred that irregularities are formed. The preferred embodiment with respect to irregularities is the same as in the resin-side release layer 2 as described above, and the preferred embodiment with respect to the surface 8a is the same as the above-described surface 2a.

The preferred range of the thickness of the mold-side release layer 8 is the same as of the resin-side release layer 5.

Thickness of Mold Release Film

The preferred range of the thickness of the mold release film 4 is the same as the mold release film 1.

Permeability of Xylene Gas at the Time of Following a Difference in Level of 2 mm of Mold Release Film Of the mold release film 4, the preferred range of the permeability of xylene gas at the time of following a difference in level of 2 mm, is the same as of the mold release film 1.

Mass Reduction Rate at 180° C. of Mold Release Film

The preferred range of the mass reduction rate at 180° C. of the mold release film 4 is the same as of the mold release film 1.

Process for Producing Mold Release Film

As a process for producing the mold release film 4, the following production process is preferred.

A production process comprising a step of forming a gas barrier layer 6 on one surface of a first resin film (substrate containing a release layer) for forming the resin-side release layer 5, and a step of dry-laminating, on the gas barrier layer 6, a second resin film for forming the mold-side release layer 8, by using an adhesive, wherein the step of forming a gas barrier layer 6 includes a step (hereinafter referred to also as "step (i-2)") of applying a gas barrier layer-forming coating liquid comprising a polymer (I) and a liquid medium, followed by drying to form a coating film.

The gas-barrier layer-forming coating liquid may further contain a crosslinking agent.

In a case where the gas barrier layer-forming coating liquid contains a crosslinking agent, the step of forming a gas barrier layer 6 preferably further contains, after the step (i-2), a step (hereinafter referred to also as "step (ii-2)") of letting the above polymer (I) be crosslinked to form a crosslinked structure.

First Resin Film

The first resin film may be the same as the resin film for forming the resin-side release layer 2, as mentioned in the first embodiment.

Second Resin Film

As the second resin film, a commercially available resin film may be used, or a resin film produced by a known production method may be used. The resin film may be one subjected to surface treatment, such as corona treatment, plasma treatment, primer coating treatment, etc.

The method for producing the second resin film is not particularly limited, and a known production method as mentioned in the description of the first resin film may be employed.

Gas Barrier Layer-Forming Coating Liquid

The gas barrier layer-forming coating liquid is the same as the gas barrier layer-forming coating liquid in the first embodiment.

Step of Forming Gas Barrier Layer

In the step of forming the gas barrier layer, the step (i-2) and the step (ii-2) are, respectively, the same as the step (i) and the step (ii) in the first embodiment.

Step of Dry Laminating Mold-Side Release Layer

The dry lamination can be carried out by a known method. For example, on the gas barrier layer 6 formed on the first resin film a, an adhesive is applied and dried, and the second resin film is overlaid thereon, whereupon the assembly is pressed by passing it between a pair of rolls (lamination rolls) heated to a predetermined temperature (dry lamination temperature). Thus, it is possible to obtain a mold release film 4. After the dry lamination, aging, cutting, etc. may be carried out, as the case requires.

Advantageous Effects

By the mold release film 4, like the mold release film 1 in the first embodiment, it is possible to reduce contamination of the mold in the sealing step of a semiconductor element. Further, mold release failure is less likely to occur, and after curing a curable resin, the formed sealed body having a resin-sealed portion can be satisfactorily released from the mold. Further, as it has the mold-side release layer 8, it is possible to prevent the gas barrier layer 6 from being transferred to the surface of the mold in the sealing process.

In the foregoing, the mold release film of the present invention has been described with reference to the first and second embodiments, but the present invention is not limited to the above embodiments. In the above embodiments, the respective constructions and their combinations, etc. are merely exemplary, and additions, omissions, substitutions or other modifications of the constructions can be made within a range not departing from the gist of the present invention.

In the second embodiment, a construction is shown in which the resin-side release layer 5, the gas barrier layer 6, the adhesive layer 7 and the mold-side release layer 8 are laminated in this order, but, the gas barrier layer 6 and the adhesive layer 7 may be interchanged. For example, the gas barrier layer 6 may be formed on the mold side releasing layer 8, and then, on the gas barrier layer 6, the resin-side release layer 5 may be dry-laminated by using an adhesive.

From such a viewpoint that it is possible to prevent permeation of outgas from the adhesive layer 7, it is preferred that the gas barrier layer 6 is provided at a position adjacent to the mold-side release layer 8.

In the second embodiment, a construction having no adhesive layer 7 may be adopted.

The mold release film of the present invention may be further provided with a layer other than the resin-side release layer, the gas barrier layer, the adhesive layer and the mold-side release layer.

As such another layer, for example, an antistatic layer may be mentioned. When the mold release film has an antistatic layer, the mold release film will exhibits antistatic property, and at the time of producing a semiconductor package, even if a part of the semiconductor element is in direct contact with the mold release film, it is possible to avoid breakage of the semiconductor element by charging/discharging of the mold release film.

From the antistatic viewpoint, the surface resistance value of the antistatic layer is preferably at most $10^{10}\Omega/\sqrt{3}$, particularly preferably at most $10^{9}\Omega/\sqrt{3}$.

As the antistatic layer, a layer containing an antistatic agent may be mentioned. As the antistatic agent, a polymer-type antistatic agent is preferred. The polymer-type antistatic agent may be a polymer compound known as an antistatic agent. It may, for example, be a cationic copolymer having a quaternary ammonium base on its side groups, an anionic polymer containing polystyrene sulfonic acid, a nonionic polymer containing a polyether ester amide, an ethylene oxide-epichlorohydrin, a polyether ester, etc., a π conjugated conductive polymer, etc. One of these may be used alone, or two or more of them may be used in combination.

An antistatic agent may be incorporated to the adhesive for forming an adhesive layer 7, to let the adhesive layer 7 have a function as an antistatic layer.

The mold release film of the present invention is preferably one having a layer structure selected from, as viewed from the side to be in contact with a curable resin at the time of forming a resin sealed portion, a two-layer structure of the resin-side release layer/the gas barrier layer, a 3-layer structure of the resin-side release layer/the gas barrier layer/the mold-side release layer, a 3-layer structure of the resin side release layer/the antistatic layer/the gas barrier layer, a 4-layer structure of the resin-side release layer/the gas barrier layer/the adhesive layer/the mold-side releasing layer, and a 4-layer structure of the resin-side release layer/the adhesive layer/the gas barrier layer/the mold-side release layer.

Among the above, from such a viewpoint that it is possible to suppress all of gases generated from the mold release film itself, preferred is a layer structure in which the gas barrier layer is located at the most mold-side, and particularly preferred is the two-layer structure of the resin-side release layer/the gas barrier layer.

Semiconductor Package

The semiconductor package to be produced by the following process for producing a semiconductor package of the present invention by using the mold release film of the present invention, may, for example, be an integrated circuit having semiconductor elements integrated, such as a transistor, a diode, etc.; a light-emitting diode having a light emitting element, etc.

The package shape of the integrated circuit may be one which covers the entire integrated circuit, or one which covers a part of the integrated circuit (exposes a part of the integrated circuit). As a specific example, BGA (Ball Grid Array), QFN (Quad Flat Non-leaded package), SON (Small Outline Non-leaded package), etc. may be mentioned.

As the semiconductor package, from the viewpoint of productivity, preferred is one to be produced through batch sealing and singulation, and, for example, an integrated circuit, etc. whereby the sealing system is a MAP (Moldied Array Packaging) system or a WL (Wafer Lebel packaging) system, may be mentioned.

Figure 3:
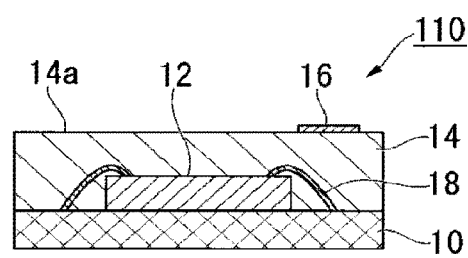
FIG. 3 is a schematic cross-sectional view showing an example of the semiconductor package to be produced by the process for producing a semiconductor package of the present invention.

FIG. 3 is a schematic cross-sectional view showing an example of the semiconductor package.

The semiconductor package 110 of this example comprises a substrate 10, a semiconductor chip (semiconductor element) 12 mounted on the substrate 10, a resin sealed portion 14 for sealing the semiconductor chip 12, and an ink layer 16 formed on the upper surface 14a of the resin sealed portion 14.

The semiconductor chip 12 has a surface electrode (not shown), the substrate 10 has a substrate electrode (not shown) corresponding to the surface electrode of the semiconductor chip 12, and the surface electrode and the substrate electrode are electrically connected to each other by a bonding wire 18.

The thickness of the resin sealed portion 14 (the shortest distance from the semiconductor chip 12-mounting surface of the substrate 10 to the upper surface 14a of the resin sealed portion 14) is not particularly limited, but it is preferably at least "the thickness of the semiconductor chip 12" and at most "the thickness of the semiconductor chip 12+1 mm", particularly preferably at least "the thickness of the semiconductor chip 12" and at most "the thickness of the semiconductor chip 12+0.5 mm".

Figure 4:
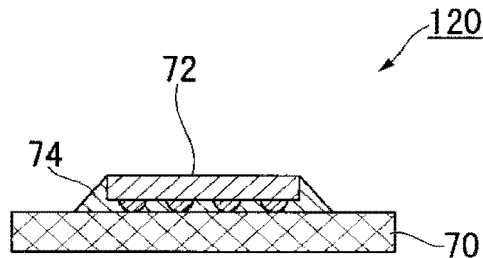
FIG. 4 is a schematic cross-sectional view showing another example of the semiconductor package to be produced by the process for producing a semiconductor package of the present invention.

FIG. 4 is a schematic cross-sectional view showing another example of the semiconductor package.

The semiconductor package 120 of this example comprises a substrate 70, a semiconductor chip (semiconductor element) 72 mounted on the substrate 70, and an underfill (resin sealed portion) 74.

The underfill 74 fills a gap between the substrate 70 and the main surface of the semiconductor chip 72 (a surface on the substrate 70 side), and the back surface of the semiconductor chip 72 (a surface opposite to the substrate 70 side) is exposed.

Process for Producing Semiconductor Package

The process for producing a semiconductor package of the present invention is a process for producing a semiconductor package formed from a semiconductor element and a curable resin, and having a resin sealed portion for sealing the semiconductor element, and comprises:

a step of disposing the above-described mold release film of the present invention on a surface of the mold to be in contact with a curable resin, a step of disposing a substrate having a semiconductor element mounted thereon, in the mold, and filling a curable resin in a space in the mold, followed by curing to form a resin sealed portion, thereby to obtain a sealed body having the substrate, the semiconductor element and the resin sealed portion, and a step of releasing the sealed body from the mold.

As the process for producing a semiconductor package of the present invention, a known production process may be employed except that the mold release film of the present invention is used. For example, as a method for forming the resin sealed portion, a compression molding method or a transfer molding method may be mentioned, and as an apparatus to be used at that time, a known compression molding apparatus or transfer molding apparatus may be employed. Production conditions may also be the same conditions as the conditions in a known method for producing a semiconductor package.

First Embodiment

Figure 5:
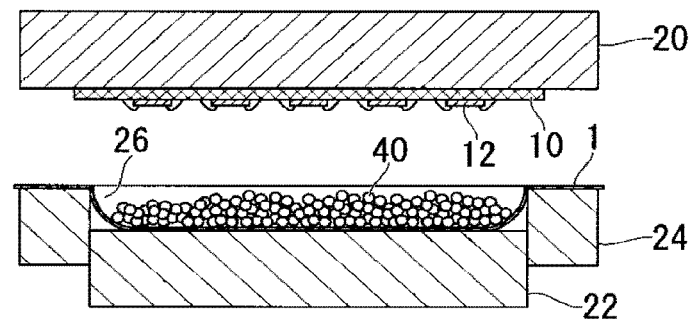
FIG. 5 is a cross-sectional view schematically illustrating steps (α1) to (α3) in the first embodiment of the process for producing a semiconductor package of the present invention.
Figure 6:
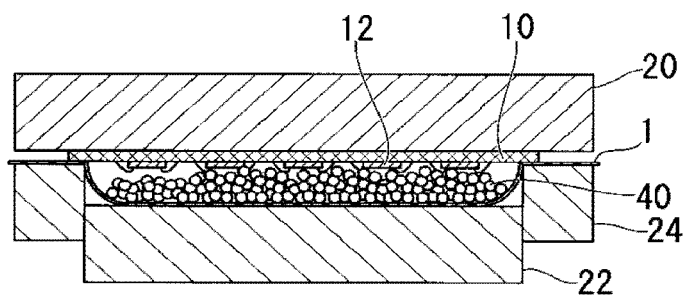
FIG. 6 is a cross-sectional view schematically illustrating a step (α4) in the first embodiment of the process for producing a semiconductor package of the present invention.
Figure 7:
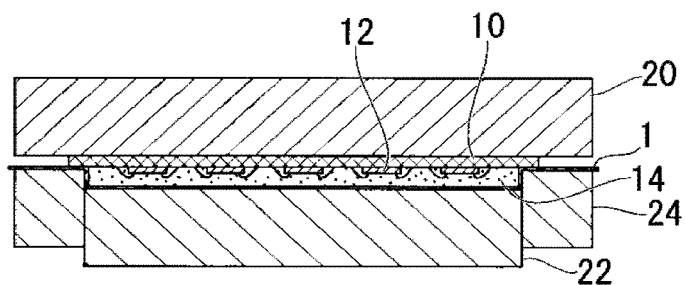
FIG. 7 is a cross-sectional view schematically illustrating a step (α4) in the first embodiment of the process for producing a semiconductor package of the present invention.

With reference to FIGS. 5 to 7, the first embodiment of the process for producing a semiconductor package of the present invention will be described. This embodiment is an example of producing the semiconductor package 110 shown in FIG. 3 by a compression molding method, by using the above-described mold release film 1 as a mold release film.

The process for producing a semiconductor package in this embodiment comprises the following steps (α1) to (α7).

(α1) A step of disposing the mold release film 1 in a mold having a fixed upper mold 20, a cavity bottom surface member 22 and a frame-form movable lower mold 24 disposed along the peripheral edge of the cavity bottom surface member 22, so that the mold release film 1 covers a cavity 26 of the mold, and the surface 2a on the resin-side release layer 2 side of the mold release film 1, faces a space in the cavity 26 (so that the surface 3a on the gas barrier layer 3 side is in contact with the cavity surface of the mold) (FIG. 5).

(α2) A step of vacuum-suctioning the mold release film 1 to the side of the cavity surface of the mold (FIG. 5).

(α3) A step of filling a curable resin 40 in the cavity 26 having the cavity surface covered by the mold release film 1 (FIG. 5).

(α4) A step of placing a substrate 10 having a plurality of semiconductor chips 12 mounted thereon, at a predetermined position in the cavity 26 and clamping the mold (FIG. 6), to collectively seal the plurality of semiconductor chips 12 by the curable resin 40 to form a resin sealed portion 14 (FIG. 7), thereby to obtain a collectively sealed body having the substrate 10, the plurality of semiconductor chips 12 mounted on the substrate 10, and the resin sealed portion 14 collectively sealing the plurality of semiconductor chips 12.

(α5) A step of taking out the collectively sealed body from inside of the mold.

(α6) A step of cutting the substrate 10 and the resin sealed portion 14 of the collectively sealed body, so as to separate the plurality of semiconductor chips 12, thereby to obtain singulated sealed bodies each having a substrate 10, at least one semiconductor chip mounted on the substrate 10 and a resin sealed portion 14 sealing the semiconductor chip 12.

(α7) A step of forming an ink layer 16 on the upper surface 14a of the resin sealed portion 14 of the singulated sealed body by using an ink, to obtain a semiconductor package 110.

Second Embodiment

With reference to FIGS. 8 to 11, a second embodiment of the process for producing a semiconductor package of the present invention will be described. This embodiment is an example in which the semiconductor package 120 shown in FIG. 4 is produced by a transfer method by using the above-described mold release film 1 as a release film.

The process for producing a semiconductor package in this embodiment comprises the following steps (β1) to (β5).

Figure 8:
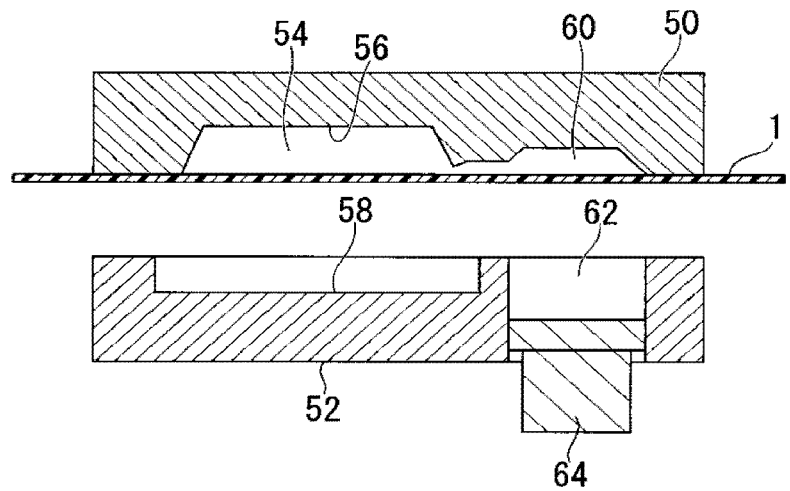
FIG. 8 is a cross-sectional view showing a step (β1) in the second embodiment of the process for producing a semiconductor package of the present invention.

(β1) A step of disposing the mold release film 1, so that the mold release film 1 covers the cavity 54 of an upper mold 50 of the mold having an upper mold 50 and a lower mold 52, and the surface 2a on the resin-side release layer 2 side of the mold release film 1 faces the space in the cavity 54 (so that the surface 3a on the gas barrier layer 3 side is in contact with the cavity surface 56 of the upper mold 50) (FIG. 8).

Figure 9:
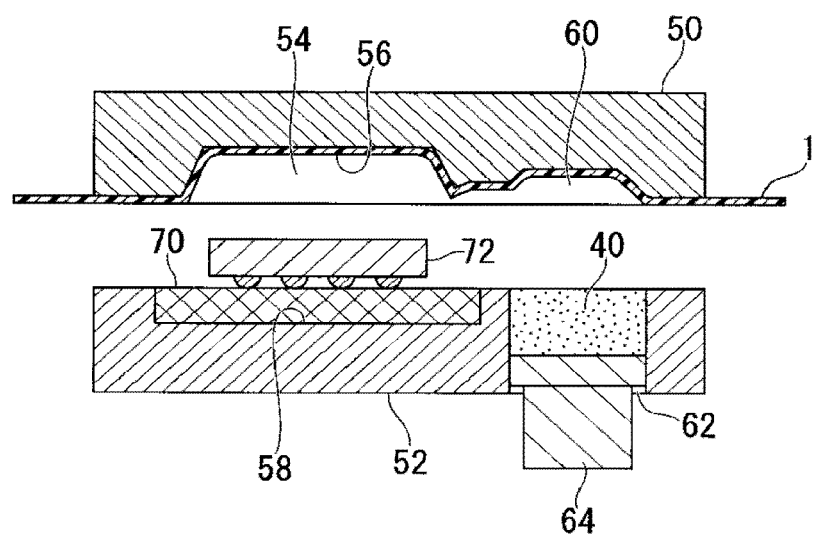
FIG. 9 is a cross-sectional view showing steps (β2) and (β3) in the second embodiment of the process for producing a semiconductor package of the present invention.

(β2) A step of vacuum-sucking the mold release film 1 to the side of the cavity surface 56 of the upper mold 50 (FIG. 9).

(β3) A step of placing a substrate 70 having a semiconductor chip 72 mounted thereon on the substrate placement portion 58 of the lower mold 52, and clamping the upper mold 50 and the lower mold 52 to let the mold release film 1 be in close contact with the back surface of the semiconductor chip 72 (the surface on the side opposite to the substrate 70 side) (FIG. 9).

Figure 10:
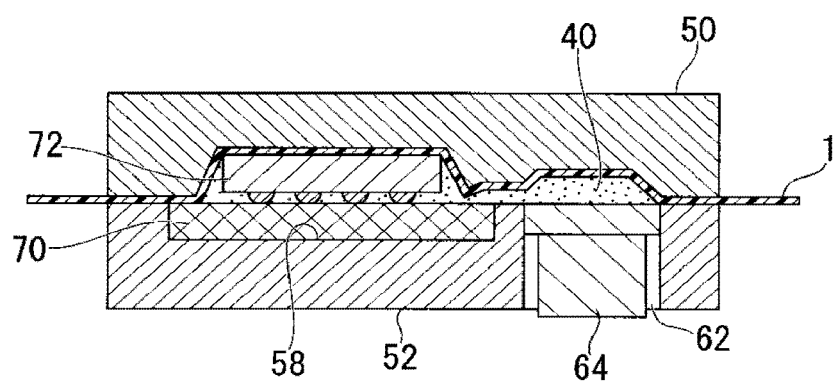
FIG. 10 is a cross-sectional view showing a step (β4) in the second embodiment of the process for producing a semiconductor package of the present invention.

(β4) A step of pushing up the plunger 64 of the resin placement portion 62 of the lower mold 52, to fill a curable resin 40 preliminarily put on the resin placement portion 62, into the cavity 54 through the resin introduction portion 60 of the upper mold 50, followed by curing to form an underfill 74, thereby to obtain a semiconductor package 120 (sealed body) having the substrate 70, the semiconductor chip 72 and the underfill 74 (FIG. 10).

Figure 11:
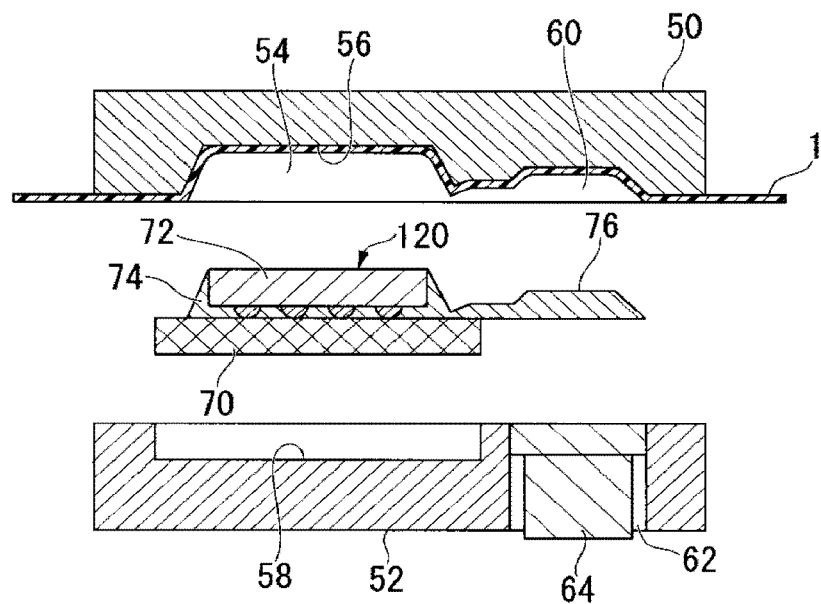
FIG. 11 is a cross-sectional view showing a step (β5) in the second embodiment of the process for producing a semiconductor package of the present invention.

(β5) A step of taking out the semiconductor package 120 from inside of the mold (FIG. 11). At that time, to the underfill 74 of the taken out semiconductor package 120, a cured product 76 having the curable resin 40 cured in the resin introduction portion 60 is attached. The cured product 76 is cut off to obtain a semiconductor package 120.

In the foregoing, the process for producing a semiconductor package of the present invention has been described with reference to the first and second embodiments, but the present invention is not limited to the above embodiments.

The respective constructions and their combinations, etc. in the above embodiments are merely exemplary, and within a range not departing from the gist of the present invention, additions, omissions, substitutions or other modifications of the constructions may be made.

In the first embodiment, an example is shown in which, after the step (α5), the step (α6) and the step (α7) are conducted in this order, but, the step (α6) and the step (α7) may be conducted in the reverse order. That is, on the surface of the resin sealed portion of the collectively sealed body taken out from the mold, an ink layer may be formed by using an ink, and then, the substrate and the resin sealed portion of the collectively sealed body may be cut.

The timing of peeling off the resin sealed portion from the mold release film is not limited to at the time of taking out the resin sealed portion from the mold, but from the mold, the resin sealed portion may be taken out together with the mold release film, and then, the mold release film may be peeled from the resin sealed portion.

The distances between adjacent ones of the collectively sealed plurality of semiconductor chips 12 may be uniform or non-uniform. From such a viewpoint that the sealing can be made uniformly, and the load to be exerted to each of the plurality of semiconductor chips 12 will be uniform (the load will be minimized), it is preferred to make the distances between adjacent ones of the plurality of semiconductor chips 12 to be uniform.

The semiconductor package 110 may be produced by a transfer molding method, as in the second embodiment, and the semiconductor package 120 may be produced by a compression molding method, as in the first embodiment.

The mold release film may be any mold release film of the present invention and is not limited to the mold release film 1. For example, a mold release film 4 may be used.

The mold in the first embodiment is not limited to that shown in FIG. 5, and one known as a mold to be used for a compression molding method, may be employed. The mold in the second embodiment is not limited to that shown in FIG. 8, and one known as a mold to be used for a transfer method may be employed.

Semiconductor packages to be produced by the process for producing a semiconductor package of the present invention are not limited to the semiconductor packages 110 and 120. Depending on the semiconductor package to be produced, the steps (α6) and (α7) may not be conducted in the first embodiment. For example, the shape of the resin sealed portion is not limited to one shown in FIG. 3 or 4, and it may have a difference in level, etc. The number of semiconductor elements to be sealed in the resin sealed portion may be one or more. The ink layer is not essential. In the case of producing a light-emitting diode as a semiconductor package, the resin sealed portion will function also as a lens unit, whereby usually, no ink layer is formed on the surface of the resin sealed portion. In the case of such a lens unit, as the shape of the resin sealed portion, a variety of lens shape may be adopted, such as hemispherical, bullet-shaped, Fresnel lens type, semi-cylindrical, substantially hemispherical lens array type, etc.

EXAMPLES

Hereinafter, the present invention will be described in detail with reference to Examples. However, the present invention is not limited by the following description.

Among Ex. 1 to 25 given below, Ex. 1 to 18 are Examples of the present invention, Ex. 19 to 25 are Comparative Examples.

The evaluation methods and materials used in the respective Ex. are as follows.

Evaluation Methods

Thickness

The thickness of a film was measured in accordance with ISO 4591: 1992 (JIS K7130: 1999, B1 method; method of measuring thickness by mass method of sample taken from plastic film or sheet). The thickness of a gas barrier layer was measured by a transmission type infrared film thickness meter RX-100 (trade name, manufactured by Kurabo Industries Ltd.).

Arithmetic Mean Roughness (Ra)

The arithmetic mean roughness (Ra) of the surface of a film was measured based on JIS B0601: 2013 (ISO4287: 1997, Amd.1: 2009). The standard length lr (cutoff value lnc) for a roughness curve was set to be 0.8 mm.

180° C. Tensile Elongation

Measured based on JIS K7127: 1999 (ISO527-3: 1995). The sample shape was No. 5 dumbbell, the measurement temperature was 180° C., and the measurement speed was 200 mm/min.

180° C. Mass Reduction Rate

A mold release film was cut out into a 10 cm square to prepare a test sample, and the mass of the test sample (the mass before heating, unit: mg) was measured using a balance. As the balance, an electronic balance L420P (trade name, manufactured by Sartorius) was used. Then, the test sample was sandwiched between a pair of stainless steel plates of a 15 cm square with a thickness of 0.2 mm (SUS304). This assembly was pressed for 20 minutes under conditions of 180° C. and 1 MPa. Thereafter, the test sample was taken out, and the mass of the test sample (the mass after heating, unit: mg) was measured in the same manner as above. From the measurement results, the mass reduction rate (%) was calculated based on the following formula.

Mass reduction rate (%)={(the mass before heating)−(the mass after heating)}/(the mass before heating)×100

Insolubility Degree of Gas Barrier Layer

Calculation of the Basis Weight (W1) of a Gas Barrier Layer

In each Ex., the basis weight (g/m$^2$) of the film (release layer) before application of a gas barrier layer-forming coating liquid (hereinafter referred to also as "the basis weight of the film before coating") and the basis weight (g/m$^2$) of the film after formation of a gas barrier layer by application of a gas barrier layer-forming coating liquid to the film (the basis weight of the sum of the film and the gas barrier layer, hereinafter referred to also as "the basis weight of the film after coating") were measured. From the results, by the following formula, the basis weight W1 (g/m$^2$) of the gas barrier layer alone was calculated).

W1=(the basis weight of the film after coating)−(the basis weight of the film before coating)

Dissolution Test

The mold release film cut into a 10 cm square was immersed and heated for 1 hour in ion-exchanged water at 80° C. Meanwhile, stirring for 1 minute was carried out at 30 minutes intervals. The stirring was carried out by using a stirrer. After completion of heating for 1 hour, the mold release film was taken out, then immersed and washed for 10 minutes in ion-exchanged water at 80° C. contained in a different container, and further immersed, washed and cooled for 10 minutes in ion-exchanged water at from 20 to 25° C. contained in a still different container. The mold release film after washing and cooling, was vacuum-dried at 100° C. for 2 hours.

Calculation of Insolubility Degree

The mass of the mold release film after vacuum drying in the above dissolution test, was measured, and the basis weight (g/m$^2$) of the mold releasing film (hereinafter referred to also as "the basis weight of the film after dissolution") was calculated. From the results, by the following formula, the basis weight W2 (g/m$^2$) of the gas barrier layer remaining after conducting the dissolution test, was calculated.

W2=(the basis weight after dissolution)−(the basis weight of the film before coating)

From the obtained W1 and W2, by the following formula, the insolubility degree (%) was obtained.

Insolubility degree (%)=(W2/W1)×100

Figure 12:
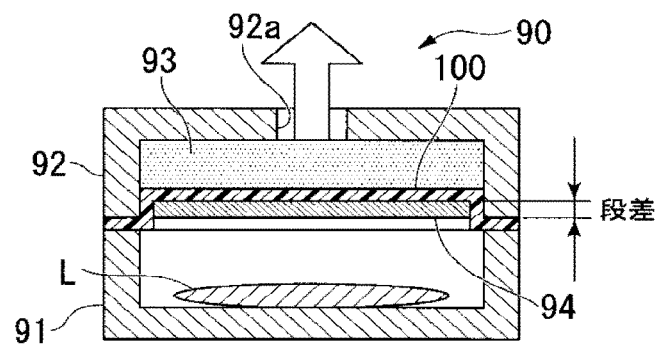
FIG. 12 is a view for illustrating a method of measuring the xylene gas permeability at the time of following a difference in level of 2 mm.

Permeability of Xylene Gas at the Time of Following a Difference in Level of 2 mm With reference to FIG. 12, this evaluation method will be described.

In a first container 91 made of aluminum and having a concave with a diameter of 60 mm and a depth of 10 mm, 1.5 g (L in FIG. 12) of xylene (manufactured by Kanto Chemical Co., Inc. xylene first class) was dropwise added.

In a concave of a second container 92 made of aluminum and having the same shape as the first container 91, a porous ceramic (alumina sintered body) 93 with a diameter of 60 mm and a thickness of 8 mm was fitted. Further, a drilled threaded hole 92a was formed at the bottom surface of the concave, and a vacuum pump TSW-200 (tradename, manufactured by Sato Vac Inc.) not shown in the drawings, was connected thereto. On the first container 91, the second container 92 was disposed so that the opening of the concave faced downward (the first container 91 side), and the first container 91 and the second container 92 were joined in such a state that the mold release film 100 and a flange 94 made of polytetrafluoroethylene were sandwiched between them, and were fixed by screws to obtain a test specimen 90. The mass (g) (hereinafter referred to as "the mass before heating") of the entire test specimen 90 was measured by an electronic balance (manufactured by Sartorius).

Then, the test specimen 90 was placed on a hot plate heated to 180° C. not shown and at the same time, the vacuum pump was switched on, followed by standing still for 15 minutes while maintaining the vacuum degree to be −100 kPa or lower. At that time, in the test specimen 90, as shown in FIG. 12, the porous ceramic 93 became a state in contact with the bottom surface of the second container 92, and a difference in level of 2 mm would be formed between the lower surface of the porous ceramic 93 and the lower end (the opening surface of the recess) of the second container 92. Further, the mold release film 100 would be stretched so as to be in close contact with the inner peripheral surface of the recess of the second container 92 and the lower surface of the porous ceramic 93. Upon expiration of 15 minutes, the vacuum pump was stopped and disconnected, whereupon the mass (g) (hereinafter referred to as "the mass after heating") of the entire test specimen was immediately measured. From the measurement results, the xylene gas permeability was calculated by the following formula.

Xylene gas permeability (%)={(the mass before heating–the mass after heating)/1.5}×100

Barrier Layer Cracking at the Time of Following a Difference in Level of 2 mm

After evaluation of the xylene gas permeability, the mold release film was taken out from the test specimen 90, and presence or absence of cracking of the gas barrier layer, was confirmed by a microscope, and evaluated by the following standards.

○ (good): No cracking was observed.
Δ (acceptable): Only at corners, cracking of the barrier layer was partially observed.
x (bad): Cracking was entirely observed.

Mold Antifouling Test

For the test, a semiconductor sealing compression molding apparatus PMC1040 (trade name, manufactured by TOWA Corporation) was used. The semiconductor sealing compression molding apparatus PMC1040 is one provided with a mold as shown in FIG. 5 (a fixed upper mold 20, a cavity bottom surface member 22, a movable lower mold 24).

Compression molding by the following procedure under the following conditions, was carried out 2,000 shots.

Compression Molding Procedure

In the semiconductor sealing compression molding apparatus PMC1040, a mold release film is unwound from a roll, then fixed on a stage and cut in a predetermined length. Thereafter, a curable resin is sown on the mold release film, and in that state, is conveyed onto a cavity formed by the cavity bottom face member 22 and the movable lower mold 24. After the mold release film is placed on the cavity, the fixed upper mold 20 and the movable lower mold 24 are clamped, and air is withdrawn by a vacuum pump from vacuum suction holes at the cavity peripheral edge, to let the mold release film follow the cavity surface and to withdraw air bubbles from the curable resin. Thereafter, the cavity bottom surface member 22 is raised to bring about a predetermined final depth and clamping force, and that state is maintained for a predetermined clamping time to conduct compression-molding.

Compression Molding Conditions

Mold temperature: 180° C.
Cavity size: 210 mm×70 mm.
Final depth of the cavity: 0.6 mm.
Curable resin: SUMIKON EME G770H type F Ver. GR (manufactured by Sumitomo Bakelite Co., Ltd.).
Degree of vacuum at the time of following the cavity surface: −85 kPa.

Degree of vacuum at the time of withdrawing air bubbles from the curable resin: −80 kPa.
Time for withdrawing air bubbles from the curable resin: 10 seconds.
Clamping time: 150 seconds.
Clamping force: $9.8 \times 10^4$ N.

Of 2,000 shots, the number of times where pinholes were formed in the mold release film and the leaked curable resin adhered to the mold to cause mold release failure, was counted, and the number of times of formation of pinholes was evaluated by the following standards.

○ (good): less than 10 times.
Δ (acceptable): less than 50 times.
x (bad): more than 50 times.

Further, the stained state of the mold after 2,000 shots was visually evaluated, and the mold antifouling property was evaluated by the following standards.

○ (good): No change was observed on the mold.
Δ (acceptable): The mold was slightly color-changed to brown.
x (bad): A viscous brown substance was attached to the mold.

Materials Used

Polymers

GOHSENOL NM-11: product name. Completely saponified PVA powder, manufactured by Nippon Synthetic Chemical Industry Co., Ltd., saponification degree 99 mol %, viscosity (20° C.) of 4 mass % aqueous solution 14 mPa·s.

GOHSENOL AL-06R: product name. Quasi-completely saponification PVA powder, manufactured by Nippon Synthetic Chemical Industry Co., Ltd., saponification degree 94 mol %, viscosity (20° C.) of 4 mass % aqueous solution 7 mPa·s.

GOHSENOL GL-05: product name. Partially hydrolyzed PVA powder, manufactured by Nippon Synthetic Chemical Industry Co., Ltd., saponification degree 89 mol %, viscosity (20° C.) of 4 mass % aqueous solution 8 mPa·s.

G-polymer OKS-1011: product name (hereinafter simply referred to also as "G-polymer"). A powder of a copolymer having 92 mol % in total of vinyl alcohol units and vinyl acetate units, and having 8 mol % of units having a 1,2-dial structural unit represented by the formula (1), manufactured by Nippon Synthetic Chemical Industry Co., Ltd., saponification degree 99 mol %, viscosity (20° C.) of 4 mass % aqueous solution 14 mPa·s.

SOARNOL D2908: product name (hereinafter simply referred to also as "Soarnol"). A powder of an ethylene-vinyl alcohol copolymer having 71 mol % in total of vinyl alcohol units and vinyl acetate units, and having 29 mol % of ethylene units, manufactured by Nippon Synthetic Chemical Co., Ltd., saponification degree 99 mol %, viscosity (20° C.) of 4 mass % aqueous solution 30 mPa·s.

Diofan 193D: product name (hereinafter simply referred to also as "Diofan").
Polyvinylidene chloride aqueous dispersion, manufactured by Solvay Plastics, solid content 30 mass %.

Crosslinking Agents

DURANATE WB40-100: product name (hereinafter simply referred to also as "Duranate"). Water-dispersible isocyanate, manufactured by Asahi Kasei Corporation. Solid content 100 mass %.

ORGATIX ZC-300: product name (hereinafter simply referred to also as "ZC-300"). Zirconium lactate ammonium salt, manufactured by Matsumoto Fine Chemical Co., Ltd. Solid content 12 mass %.

ORGATIX TC-300: product name (hereinafter simply referred to also as "TC-300"). Lactic acid titanate ammonium salt, manufactured by Matsumoto Fine Chemical Co., Ltd. Solid content 42 mass %.

ORGATIX T-2762: product name (hereinafter simply referred to also as "T-2762"). Organotitanium compound, manufactured by Matsumoto Fine Chemical Co., Ltd. Solid content 62 mass %.

Gas Barrier Layer-Forming Coating Liquids

Gas barrier layer-forming coating liquids 1 to 12: prepared by mixing the materials listed in Table 1.

Among the materials in Table 1, the blend amounts of Diofan, ZC-300, TC-300 and T-2762 are not solid contents, but amounts including a liquid medium (for example, in the case of Diofan, the amount as a polyvinylidene chloride aqueous dispersion).

ETFE film 3: Fluon ETFE C-88AXP (manufactured by Asahi Glass Company, Limited) was fed to an extruder equipped with a T-die, and taken on a cooling roll with mirror surface, to form a film of 12 μm in thickness. The temperature of the extruder and the T-die was 320° C., and the temperature of the cooling roll was 180° C. Ra of the surface of the obtained film was 0.1 μm on both sides. One side was subjected to corona treatment so that the wetting tension based on ISO8296: 1987 (JIS K6768 1999) would be at least 40 mN/m.

LM-ETFE film: Fluon LM-ETFE LM720AP (manufactured by Asahi Glass Company, Limited), was fed to an extruder equipped with a T-die, and taken in between a pressing roll with surface irregularities and a cooling roll with mirror surface, to form a film of 50 μm in thickness. The temperature of the extruder and the T-die was 300° C., and the temperature of the pressing roll and the cooling roll was 100° C. Ra of the surface of the obtained film was 2.0 μm at the pressing roll side and 0.2 μm at the mirror surface side. The mirror surface side was subjected to corona treatment so that the wetting tension based on ISO8296: 1987 (JIS K6768 1999) would be at least 40 mN/m.

TABLE 1

| | | | Gas barrier layer-forming coating liquid | | | | | | | | | | | |
|---|---|---|---|---|---|---|---|---|---|---|---|---|---|---|
| | | | 1 | 2 | 3 | 4 | 5 | 6 | 7 | 8 | 9 | 10 | 11 | 12 |
| Blend amounts (parts by mass) | Polymer | GOHSENOL NM-11 | 10 | 10 | | | | | | | | | | |
| | | GOHSENOL AL-06R | | | 10 | | | | | | | | | |
| | | GOHSENOL GL-05 | | | | 10 | | | | | | | | |
| | | G-polymer | | | | | | 10 | 10 | 10 | 10 | 10 | | | |
| | | SOARNOL | | | | | | | | | | | 10 | 10 | |
| | | Diofan | | | | | | | | | | | | | 33 |
| | Crosslinking agent | DURANATE | | | | | | 0.5 | | | | | | | |
| | | ZC-300 | | 42 | 42 | 42 | | | 42 | | | | 42 | | |
| | | TC-300 | | | | | | | | 1.2 | | | | | |
| | | T-2762 | | | | | | | | | 0.8 | | | | |
| | Liquid medium | Ion exchange water | 90 | 48 | 48 | 48 | 90 | 89.5 | 48 | 88.8 | 89.2 | 90 | 48 | 67 |
| | Polymer concentration (mass %) | | 10 | 10 | 10 | 10 | 10 | 10 | 10 | 10 | 10 | 10 | 10 | 10 |
| | Crosslinking agent concentration (mass %) | | — | 5.0 | 5.0 | 5.0 | — | 0.5 | 5.0 | 0.5 | 0.5 | — | 5.0 | — |

Films

ETFE film 1: Fluon ETFE C-88AXP (manufactured by Asahi Glass Company, Limited) was fed to an extruder equipped with a T-die, and taken in between a pressing roll with surface irregularities and a metal roll with mirror surface, to form a film of 50 μm in thickness. The temperature of the extruder and the T-die was 320° C., and the temperature of the pressing roll and the metal roll was 100° C. Ra of the surface of the obtained film was 2.0 μm at the pressing roll side and 0.2 μm at the mirror surface side. The mirror surface side was subjected to corona treatment so that the wetting tension based on ISO8296: 1987 (JIS K6768 1999) would be at least 40 mN/m.

ETFE film 2: Fluon ETFE C-88AXP (manufactured by Asahi Glass Company, Limited) was fed to an extruder equipped with a T-die, and taken in between a pressing roll with surface irregularities and a cooling roll with mirror surface, to form a film of 25 μm in thickness. The temperature of the extruder and the T-die was 320° C., and the temperature of the pressing roll and the cooling roll was 100° C. Ra of the surface of the obtained film was 2.0 μm at the pressing roll side and 0.2 μm at the mirror surface side. The mirror surface side was subjected to corona treatment so that the wetting tension based on ISO8296: 1987 (JIS K6768 1999) would be at least 40 mN/m.

Polymethylpentene film: TPX MX004 (manufactured by Mitsui Chemicals, Inc.) was fed to an extruder equipped with a T-die, and taken in between a pressing roll with surface irregularities and a cooling roll with mirror surface, to form a film of 50 μm in thickness. The temperature of the extruder and the T-die was 300° C., and the temperature of the pressing roll and the cooling roll was 100° C. Ra of the surface of the obtained film was 2.0 μm at the pressing roll side and 0.2 μm at the mirror surface side. The mirror surface side was subjected to corona treatment, so that the wetting tension based on ISO8296: 1987 (JIS K6768 1999) would be at least 40 mN/m.

Syndiotactic polystyrene film: XAREC 142ZE (manufactured by Idemitsu Kosan Co., Ltd.) was fed to an extruder equipped with a T-die, and taken on a cooling roll with mirror surface and subjected to stretching simultaneously in the flow direction of the film, and in a direction perpendicular to the flow direction, to form a film of 50 μm in thickness. The temperature of the extruder and the T-die was 270° C., the temperature of the cooling roll was 100° C., the stretching temperature was 115° C., the stretching ratio was 3.3 times in both the flow direction and the direction perpendicular to the flow direction, and the stretching speed was 500%/min. Further, after the stretching process, heat treatment was conducted at 215° C. Furthermore, in order to form irregularities on one side of the film, so-called sand matting treatment by blowing sand was conducted. Ra of the surface of the obtained film was 1.3 μm at the sand matting treatment surface and 0.1 μm at the untreated surface. The untreated surface was subjected to corona treatment, so that the wetting tension based on ISO8296: 1987 (JIS K6768 1999) would be at least 40 mN/m.

EVAL film: An ethylene-vinyl alcohol copolymer film (manufactured by Kuraray Co., Ltd., trade name: EVAL EF-F) of 12 μm in thickness was used.

Easily moldable PET film: Easily moldable PET film (manufactured by Teijin DuPont Films, trade name: TEFLEX FT3PE) of 25 μm in thickness was used.

Nylon film: A non-stretched nylon film of 25 μm in thickness (manufactured by Mitsubishi Plastics, Inc., trade name: DIAMIRON C-Z) was used.

Adhesive

An adhesive was prepared by mixing 60 parts of polyester polyol (manufactured by DIC CORPORATION, CRISVON NT-258), 3.4 parts of an isocyanate adduct (manufactured by Nippon Polyurethane Industry Co. Ltd Coronate 2096) and 63.4 parts of ethyl acetate.

Ex. 1 to 17, 19 to 20

On one side of a film shown in the column for resin-side release layer in Tables 2 to 3, a gas barrier layer-forming coating liquid shown in Tables 2 to 3, was applied by using a gravure coater, by a direct gravure method, so as to be a thickness of gas barrier layer shown in Tables 2 to 3 (coating thickness of the solid content), and dried, to form a gas barrier layer. In a case where the coating thickness (solid content) was from 0.1 to 1 μm, as the gravure cylinder, a roll with grating 150# of 100 mm diameter×250 mm width–depth of 40 μm was used, and in a case where the coating thickness (solid content) was more than 1 μm, a roll with grating 125#—depth of 85 μm was used. The drying was carried out at 100° C. for 1 minute through a roll support drying furnace with air flow of 19 m/sec. After the drying, aging was conducted in an oven at 40° C. for 3 days. Thus, a mold release film having a layer construction of resin side release layer/gas barrier layer was obtained.

Ex. 18

In the same manner as in Ex. 7 except that the film used for the resin-side release layer was changed, a gas barrier layer-forming coating liquid 7 was applied and dried to form a gas barrier layer.

Then, on one side of a film shown in the column for mold-side release layer in Table 3, an adhesive was applied and dried to form an adhesive layer. The application of the adhesive was conducted so that the applied thickness would be 0.3 μm (solid content) by using a gravure coater by a direct gravure method, using as a gravure cylinder, a roll with grating 150# of 100 mm diameter×250 mm width–depth of 40 μm. The drying was carried out at 100° C. for 1 minute through a roll support drying furnace with air flow of 19 m/sec.

The above respective films were overlaid so that the gas barrier layer and the adhesive layer were in contact with each other, and passed between a pair of rolls and laminated. The conditions for the lamination were a roll temperature of 50° C. and a laminate pressure of 0.5 MPa. After the lamination, aging was conducted in an oven at 40° C. for 3 days. Thus, a mold release film having a layer construction of resin side release layer/gas barrier layer/adhesive layer/mold-side release layer was obtained.

Ex. 21, 22 and 24

On one side of a film shown in the column for gas barrier layer in Table 4, an adhesive was applied and dried to form an adhesive layer. On the adhesive layer, a film shown in the column for resin-side release layer in Table 4 was overlaid and laminated by passing between a pair of rolls. The conditions for the application and drying of the adhesive, as well as the lamination, were the same as in Ex. 18.

Then, on the opposite side of the gas barrier layer, an adhesive was applied and dried to form an adhesive layer. On the adhesive layer, a film shown in the column for mold-side release layer in Table 3 was overlaid and laminated by passing between a pair of rolls. The conditions for the application and drying of the adhesive, as well as the lamination, were the same as in Ex. 18. After the lamination, aging was carried out in an oven at 40° C. for 3 days. Thus, a release film having a layer construction of resin side release layer/adhesive layer/gas barrier layer/adhesive layer/mold-side release layer was obtained.

Ex.23

On ETFE film 1, an aluminum vapor-deposited layer having a thickness of 1 μm was formed by a physical vapor deposition (PVD) method. Thus, a mold release film having a layer construction of resin side release layer/gas barrier layer was obtained.

Ex. 25

ETFE film 1 was used as it was, as a mold release film in Ex. 25.

With respect to the mold release films in Ex. 1 to 25, the results of 180° C. tensile elongation, 180° C. mass reduction rate, insolubility degree of gas barrier layer, xylene gas permeability and barrier layer cracking at the time of following a difference in level of 2 mm, mold antifouling property, and the number of times for forming pinholes, are shown in Tables 2 to 4.

TABLE 2

| Ex. | 1 | 2 | 3 | 4 | 5 | 6 | 7 | 8 | 9 |
|---|---|---|---|---|---|---|---|---|---|
| Resin-side release layer | ETFE film 1 | ETFE film 1 | ETFE film 1 | ETFE film 1 | ETFE film 1 | ETFE film 1 | ETFE film 1 | ETFE film 1 | ETFE film 1 |
| Gas barrier layer-forming coating liquid | 1 | 2 | 3 | 4 | 5 | 6 | 7 | 8 | 9 |
| Thickness of gas barrier layer (μm) | 1 | 1 | 1 | 1 | 1 | 1 | 1 | 1 | 1 |
| Mold-side release layer | — | — | — | — | — | — | — | — | — |
| Insolubility degree of gas barrier layer (%) | 0 | 60 | 60 | 60 | 0 | 20 | 60 | 80 | 95 |

TABLE 2-continued

| Ex. | 1 | 2 | 3 | 4 | 5 | 6 | 7 | 8 | 9 |
|---|---|---|---|---|---|---|---|---|---|
| 180° C. tensile elongation (%) | 700 | 700 | 700 | 700 | 700 | 700 | 700 | 700 | 700 |
| Barrier layer cracking at the time of following a difference in level of 2 mm | ○ | ○ | ○ | ○ | ○ | ○ | ○ | ○ | Δ |
| Xylene gas permeability at the time of following a difference in level of 2 mm (%) | 7 | 7 | 10 | 15 | 7 | 7 | 7 | 7 | 15 |
| 180° C. mass reduction rate (%) | 0.10 | 0.05 | 0.05 | 0.05 | 0.10 | 0.07 | 0.05 | 0.03 | 0.01 |
| Number of times for formation of pinholes | ○ | ○ | ○ | ○ | ○ | ○ | ○ | ○ | ○ |
| Mold antifouling property | ○ | ◎ | ○ | ○ | ○ | ◎ | ◎ | ◎ | ○ |

TABLE 3

| Ex. | 10 | 11 | 12 | 13 | 14 | 15 | 16 | 17 | 18 |
|---|---|---|---|---|---|---|---|---|---|
| Resin-side release layer | ETFE film 1 | ETFE film 1 | ETFE film 1 | Polymethylpentene film | Syndiotactic polystyrene film | LM-ETFE film | ETFE film 1 | ETFE film 1 | ETFE film 2 |
| Gas barrier layer-forming coating liquid | 10 | 11 | 12 | 7 | 7 | 7 | 7 | 7 | 7 |
| Thickness of gas barrier layer (μm) | 1 | 1 | 1 | 1 | 1 | 1 | 0.1 | 5 | 1 |
| Mold-side release layer | — | — | — | — | — | — | — | — | ETFE film 2 |
| Insolubility degree of gas barrier layer (%) | 0 | 60 | 0 | 60 | 60 | 60 | 60 | 60 | 60 |
| 180° C. tensile elongation (%) | 700 | 700 | 700 | 700 | 700 | 700 | 700 | 700 | 700 |
| Barrier layer cracking at the time of following a difference in level of 2 mm | ○ | ○ | ○ | ○ | ○ | ○ | ○ | ○ | ○ |
| Xylene gas permeability at the time of following a difference in level of 2 mm (%) | 15 | 15 | 15 | 7 | 7 | 7 | 15 | 4 | 7 |
| 180° C. mass reduction rate (%) | 0.10 | 0.05 | 0.10 | 0.07 | 0.07 | 0.05 | 0.00 | 0.10 | 0.07 |
| Number of times for formation of pinholes | ○ | ○ | ○ | ○ | ○ | ○ | ○ | Δ | ○ |
| Mold antifouling property | ○ | ○ | ○ | ◎ | ◎ | ◎ | ○ | ○ | ◎ |

TABLE 4

| Ex. | 19 | 20 | 21 | 22 | 23 | 24 | 25 |
|---|---|---|---|---|---|---|---|
| Resin-side release layer | ETFE film 1 | ETFE film 1 | ETFE film 3 | ETFE film 3 | ETFE film 1 | ETFE film 3 | ETFE film 1 |
| Gas barrier layer-forming coating liquid | 7 | 7 | — | — | — | — | — |
| Gas barrier layer | Crosslinked G-polymer | Crosslinked G-polymer | EVAL film | Easily moldable PET film | Aluminum vapor-deposited layer | Nylon film | — |
| Thickness of gas barrier layer (μm) | 7 | 0.05 | 12 | 25 | 1 | 25 | — |
| Mold-side release layer | — | — | ETFE film 3 | ETFE film 3 | — | ETFE film 3 | — |
| Insolubility degree of gas barrier layer (%) | 60 | 60 | — | — | — | — | — |
| 180° C. tensile elongation (%) | 700 | 700 | 250 | 250 | 700 | 250 | 700 |
| Barrier layer cracking at the time of following a difference in level of 2 mm | ○ | ○ | ○ | ○ | × | ○ | — |
| Xylene gas permeability at the time of following a difference in level of 2 mm (%) | 3 | 25 | 2 | 12 | 60 | 10 | 90 |
| 180° C. mass reduction rate (%) | 0.18 | 0.00 | 0.26 | 0.27 | 0.00 | 0.24 | 0.00 |
| Number of times for formation of pinholes | Δ | ○ | × | × | ○ | × | ○ |
| Mold antifouling property | × | × | × | × | × | × | × |

As shown in the above results, the mold release films in Ex. 1 to 18 had a large tensile elongation at high temperatures, and were less likely to undergo cracking of the gas barrier layer, or formation of pinholes, etc. at the time of following a difference in level of 2 mm. Further, even if the gas barrier layer was thin at a level of from 1 to 5 μm, they exhibited sufficient gas barrier properties at the time of following a difference in level of 2 mm. Further, the 180° C. mass reduction rate was low, and it was confirmed that outgassing was less at high temperatures. The results of evaluation of the mold antifouling property close to the actual evaluation was also good.

Among the above, when the mold release films in Ex. 5 to 9 wherein the polymer was the same and the insolubility degree was different, were compared, the mold antifouling evaluation results were excellent particularly in cases where the insolubility degree was from 20% to 80%.

When Ex. 1, 5, 10 and 12 were compared wherein the gas-barrier layer-forming coating liquid did not contain a crosslinking agent, and the type of the polymer was different, with respect to the gas barrier property (xylene gas permeability) at the time of following a difference in level of 2 mm, the results in Ex. 1 and 5 were excellent wherein the polymer was PVA or the copolymer (A11-1).

When Ex. 2 to 4 were compared wherein only the degree of saponification of PVA was different, the higher the degree of saponification, the better the gas barrier property (xylene gas permeability) at the time of following a difference in level of 2 mm.

When Ex. 7, 13 to 15 are compared wherein only the film used for the resin-side release layer was different, in Ex. 7 and 15 wherein the resin was a fluorine resin, the 180° C. mass reduction rate was lower.

When Ex. 7 and Ex. 18 were compared, although the thickness of the entire mold release film was substantially the same, in Ex. 7, the 180° C. mass reduction rate was lower. This is considered to be probably because there was outgassing from the adhesive layer in Ex. 18.

On the other hand, the mold release film in Ex. 19 using a gas barrier layer of 7 μm in thickness, had a large 180° C. mass reduction rate as compared with Ex. 1 to 18, and outgassing was substantial at high temperatures. Therefore, the evaluation result of the mold antifouling property was poor.

The mold release film in Ex. 20 using a gas barrier layer of 0.05 μm in thickness, was insufficient in gas barrier properties at the time of following a difference in level of 2 mm, because the thickness of the release layer was thin. Therefore, the evaluation result of the mold antifouling property was poor.

The mold release film in Ex. 21 using an ethylene-vinyl alcohol copolymer film of 12 μm in thickness, as the gas barrier layer, was found to have a greater 180° C. mass reduction rate as compared with Ex. 1 to 18, and outgassing was substantial at high temperatures. Further, the tensile elongation at a high temperature was low, and the number of times for formation of pinholes was large. The evaluation result of the mold antifouling property was also poor.

The same tendency as in Ex. 21 was observed also in the evaluation results of the mold release film in Ex. 22 using a easily moldable PET film of 25 μm in thickness, as the gas barrier layer, and in the evaluation results of the mold release film in Ex. 24 using a non-stretched nylon film of 25 μm in thickness, as the gas barrier layer.

In the mold release film in Ex. 23 using an aluminum vapor-deposited layer of 1 μm in thickness as the gas barrier layer, cracking of the gas barrier layer occurred at the time of following a difference in level of 2 mm, and the gas barrier property was impaired. The evaluation result of the mold antifouling property was also poor.

The mold release film in Ex. 25 using the ETFE film 1 as it was, had low gas barrier property, and the evaluation result of the mold antifouling property was poor.

INDUSTRIAL APPLICABILITY

The mold release film of the present invention is excellent in mold releasing property at the time of sealing a semiconductor element with a curable resin and is capable of reducing contamination of the mold in the process for sealing a semiconductor element. As a semiconductor package obtainable by using the mold release film of the present invention, an integrated circuit having semiconductor elements integrated, such as a transistor, a diode etc.; a light emitting diode having a light-emitting element, etc. may be mentioned.

This application is a continuation of PCT Application No. PCT/JP2015/081989, filed on Nov. 13, 2015, which is based upon and claims the benefit of priority from Japanese Patent Application No. 2014-235735 filed on Nov. 20, 2014. The contents of those applications are incorporated herein by reference in their entireties.

REFERENCE SYMBOLS

1: mold release film, 2: resin-side release layer, 3: gas barrier layer, 4: mold release film, 5: resin-side release layer, 6: gas barrier layer, 7: adhesive layer, 8: mold-side release layer, 10: substrate, 12: semiconductor chip (semiconductor element), 14: resin sealed portion, 14a: upper surface of the resin sealed portion 14, 16: ink layer, 18: bonding wire, 20: fixed upper mold, 22: cavity bottom member, 24: movable lower mold, 26: cavity, 40: curable resin, 50: upper mold, 52: lower mold, 54: cavity, 56: cavity surface, 58: substrate placement portion, 60: resin introduction portion, 62: resin placement portion, 64: plunger, 70: substrate, 72: semiconductor chip (semiconductor element), 74: underfill (resin sealed portion), 76: cured product, 90: test specimen, 91: first container, 92: second container, 92a: threaded hole, 93: porous ceramics, 94: flange, L: xylene, 100: mold release film, 110: semiconductor package, 120: semiconductor package

What is claimed is:

1. A mold release film comprising:
   a resin-side release layer to be in contact with a curable resin at the time of curing the curable resin; and
   a gas barrier layer,
   wherein the gas barrier layer comprises a polymer (1) comprising:
      vinyl alcohol units;
      vinyl acetate units; and
      units other than vinyl alcohol units or vinyl acetate units, which are at least one selected from the group consisting of units having a dihydroxy alkyl group, units having an acetoacetyl group, units having an oxyalkylene group, units having a carboxy group, units having an alkoxycarbonyl group, and units derived from an olefin, and
   wherein the thickness of the gas barrier layer is from 0.1 to 5 μm.

2. The mold release film according to claim 1, wherein the units other than vinyl alcohol units or vinyl acetate units, are represented by formula (1):

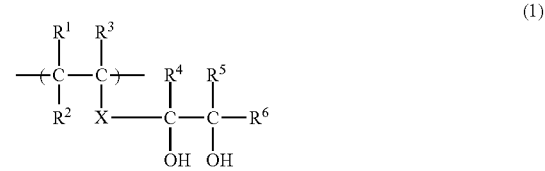

wherein:
   $R^1$ to $R^6$ are each independently a hydrogen atom or a monovalent organic group; and
   X is a single bond or a bonding chain.

3. The mold release film according to claim 1, wherein the polymer (I) has a crosslinked structure.

4. The mold release film according to claim 3, wherein the insolubility degree of the gas barrier layer obtainable by the following formula from the basis weight W1 (g/m$^2$) of the gas barrier layer and the basis weight W2 (g/m$^2$) of the gas barrier layer remaining after subjecting the mold release film to a dissolution test, is from 10 to 80%:

Insolubility degree (%)=(W2/W1)×100.

provided that the dissolution test is conducted by heating the mold release film for 1 hour by immersing the mold release film in ion-exchanged water of 80° C., during which stirring for 1 minute is repeated at 30 minutes intervals; then by washing the mold release film by immersing the mold release film in ion-exchanged water of 80° C. for 10 minutes which is different from the ion-exchanged water used in the heating; then by immersing the mold release film in ion-exchanged water of from 20 to 25° C. for 10 minutes to wash and cool the mold release film; and then by vacuum-drying the mold release film at 100° C. for 2 hours.

5. The mold release film according to claim 1, wherein the thickness of the resin-side release layer is from 12 to 100 μm.

6. The mold release film according to claim 1, wherein the resin-side release layer comprises a fluororesin.

7. The mold release film according to claim 6, wherein the fluororesin is an ethylene-tetrafluoroethylene copolymer.

8. The mold release film according to claim 1, wherein the mold release film has a two-layer structure of the resin-side release layer and the gas barrier layer.

9. A process for producing the mold release claim 1, the process comprising:
   applying a gas barrier layer-forming coating liquid on one surface of a substrate comprising the resin-side release layer to form a coating film, the gas barrier layer-forming coating liquid comprising the polymer (I) and a liquid medium; and
   drying the coating film to form the gas barrier layer.

10. The process for producing the mold release film according to claim 9, wherein:
   the gas barrier layer-forming coating liquid further comprises a crosslinking agent; and
   after forming the coating film, the polymer (I) is crosslinked with the crosslinking agent to form a crosslinked structure.

11. The process for producing the mold release film according to claim 10, wherein an amount of the crosslinking agent in the gas barrier layer-forming coating liquid is from 1 to 20 mass % with respect to an amount of the polymer (I).

12. The process for producing the mold release film according to claim 9, wherein
   the liquid medium is an aqueous medium.

13. A process for producing a semiconductor package, comprising:
   disposing the mold release film of claim 1, on a surface of a mold which is to be in contact with a curable resin;
   disposing a substrate having a semiconductor element mounted thereon, in the mold, and filling the curable resin in a space in the mold,
   curing the curable resin to form a resin sealed portion, thereby obtaining a sealed body comprising the substrate, the semiconductor element and the resin sealed portion; and
   releasing the sealed body from the mold.

* * * * *